(12) United States Patent
Takata et al.

(10) Patent No.: US 7,220,532 B2
(45) Date of Patent: May 22, 2007

(54) CHEMICAL AMPLIFICATION TYPE RESIST COMPOSITION

(75) Inventors: Yoshiyuki Takata, Toyonaka (JP); Isao Yoshida, Ikeda (JP); Hirotoshi Nakanishi, Mishima-gun (JP)

(73) Assignee: Sumitomo Chemical Company, Limited, Osaka (JP)

( * ) Notice: Subject to any disclaimer, the term of this patent is extended or adjusted under 35 U.S.C. 154(b) by 271 days.

(21) Appl. No.: 10/657,149

(22) Filed: Sep. 9, 2003

(65) Prior Publication Data

US 2004/0053171 A1 Mar. 18, 2004

(30) Foreign Application Priority Data

Sep. 12, 2002 (JP) .............................. 2002-266539

(51) Int. Cl.
*G03F 7/039* (2006.01)
(52) U.S. Cl. .................. 430/270.1; 430/910; 430/914; 430/921; 430/919
(58) Field of Classification Search ............. 430/270.1, 430/914, 921, 910, 919
See application file for complete search history.

(56) References Cited

U.S. PATENT DOCUMENTS

| 6,479,210 B2 * | 11/2002 | Kinoshita et al. ......... 430/270.1 |
| 6,753,128 B2 * | 6/2004 | Lee et al. ................. 430/270.1 |

FOREIGN PATENT DOCUMENTS

| JP | 07-092681 | * | 4/1995 |
| JP | 2001-5184 A | | 1/2001 |

OTHER PUBLICATIONS

CAplus Abstract DN 124:131526 for JP 07-092681, Apr. 1995.*
English Translation of Examples in JP 07-092681, Apr. 1995, claims, sections 1-137,139-149.*

Wakisaka, T. et al. Development of Advanced ArF Resist Using Alicyclic Methacrylate Copolymer,SPIE,3999,2000,1088-1099.*

* cited by examiner

*Primary Examiner*—Richard L. Schilling
(74) *Attorney, Agent, or Firm*—Sughrue Mion, PLLC

(57) ABSTRACT

The present invention provides a chemical amplification type positive resist composition comprising
a nitrogen containing compound of the formula (VIa) or (VIb);

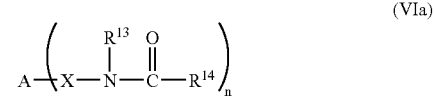

(VIa)

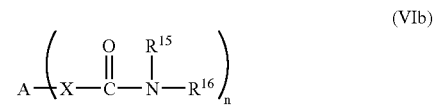

(VIb)

resin which contains a structural unit having an acid labile group and which itself is insoluble or poorly soluble in an alkali aqueous solution but becomes soluble in an alkali aqueous solution by the action of an acid; and
an acid generator of the formula (I)

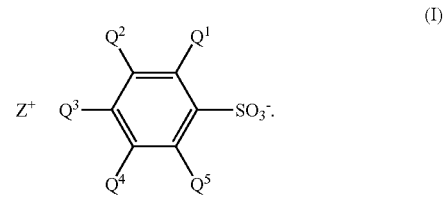

(I)

15 Claims, No Drawings

CHEMICAL AMPLIFICATION TYPE RESIST COMPOSITION

BACKGROUND OF THE INVENTION

1. Field of the Invention

The present invention relates to a chemical amplification type resist composition for use in microfabrication of semiconductor.

2. Prior Art

Semiconductor microfabrication employs a lithography process using a resist composition. In lithography, theoretically, the shorter the exposure wavelength becomes, the higher the resolution can be made, as expressed by Rayleigh's diffraction limit formula. The wavelength of an exposure light source for lithography used in the manufacture of semiconductor devices has been shortened year by year as g line having a wavelength of 436 nm, i line having a wavelength of 365 nm, KrF excimer laser having a wavelength of 248 nm and ArF excimer laser having a wavelength of 193 mm. $F_2$ excimer laser having a wavelength of 157 nm seems to be promising as the next-generation exposure light source. Further, as the exposure light source of the subsequent generation, soft X ray (EUV) having a wavelength of 13 nm or shorter has been proposed as the exposure light source following the 157 nm-wavelength $F_2$ excimer laser.

Since light sources having shorter wavelength than that of g line and i line, such as excimer laser and the like have low illumination, it is necessary to enhance the sensitivity of a resist. Consequently, there are used so-called chemical amplification type resists utilizing the catalytic action of an acid produced from a sulfonium salt and the like by exposure and containing a resin having a group being dissociated by this acid.

However, in conventionally known chemical amplification type resist compositions, there is a problem that uniformity of line width deteriorates after etching caused by poor rectangularity of patterns.

SUMMARY OF THE INVENTION

An object of the present invention is to provide a chemical amplification type positive resist composition which possesses a high sensitivity and high resolution, gives, in particular, greatly improved rectangularity of profiles and is suitable for excimer laser lithography using ArF, KrF and the like.

The present invention relates to the followings:

<1> A chemical amplification type positive resist composition comprising a nitrogen containing compound of the formula (VIa) or (VIb);

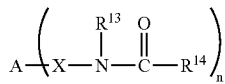

(VIa)

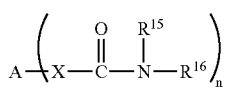

(VIb)

wherein A represents a alicyclic hydrocarbon group optionally substituted, X represents alkylene having 1 to 4 carbon atoms or a single bond, $R^{13}$, $R^{15}$ and $R^{16}$ each independently represent hydrogen, alkyl having 1 to 12 carbon atoms, cycloalkyl having 3 to 12 carbon atoms, haloalkyl having 1 to 12 carbon atoms, alkyl having 2 to 12 carbon atoms in which at least one —$CH_2$— other than that binding to the adjacent group is substituted by —S— or —O—, alkoxy having 1 to 12 carbon atoms, or aromatic group optionally substituted, $R^{14}$ represents hydrogen, alkyl having 1 to 12 carbon atoms, cycloalkyl having 3 to 12 carbon atoms, haloalkyl having 1 to 12 carbon atoms, alkyl having 2 to 12 carbon atoms in which at least one —$CH_2$— other than that binding to the adjacent group is substituted by —S— or —O—, alkoxy having 1 to 12 carbon atoms, aromatic hydrocarbon group optionally substituted, or arylamino optionally substituted, and n denote integer of 1 to 5, with the proviso that when n is 2 or more, each of —X—$NR^{13}$—CO—$R^{14}$ in the formula (VIa) or each of —X—CO—$NR^{15}R^{16}$ in the formula (VIb) may be different, resin which contains a structural unit having an acid labile group and which itself is insoluble or poorly soluble in an alkali aqueous solution but becomes soluble in an alkali aqueous solution by the action of an acid; and an acid generator of the formula (I)

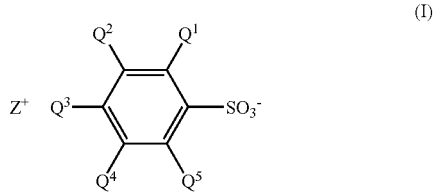

(I)

wherein $Q^1$, $Q^2$, $Q^3$, $Q^4$ and $Q^5$ each independently represent hydrogen, hydroxyl, alkyl having 1 to 12 carbon atoms, alkoxy having 1 to 12 carbon atoms or electron-withdrawing group, and $Z^+$ represents a group of the formula (Va), (Vb) or (Vc).

A group of the formula (Va)

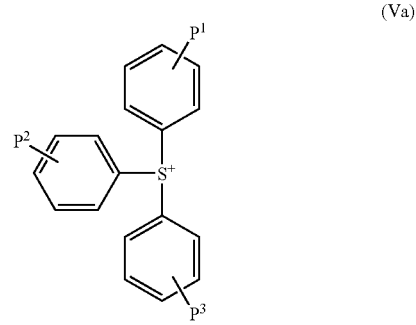

(Va)

wherein $P^1$, $P^2$ and $P^3$ each independently represent hydrogen, hydroxyl, alkyl having 1 to 6 carbon atoms or alkoxy having 1 to 6 carbon atoms.

A group of the formula (Vb)

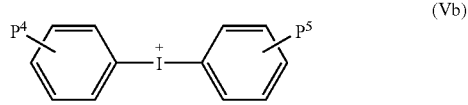

(Vb)

wherein $P^4$ and $P^5$ each independently represent hydrogen, hydroxyl, alkyl having 1 to 6 carbon atoms or alkoxy having 1 to 6 carbon atoms.

A group of the formula (Vc)

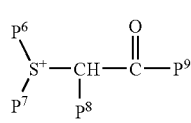

wherein $P^6$ and $P^7$ each independently represent alkyl having 1 to 6 carbon atoms or cycloalkyl having 3 to 10 carbon atoms, or $P^6$ and $P^7$ bond to form divalent acyclic hydrocarbon having 3 to 7 carbon atoms which form a ring together with the adjacent $S^+$, and at least one —$CH_2$— in the divalent acyclic hydrocarbon may be substituted by —CO—, —O— or —S—; $P^8$ represents hydrogen, $P^9$ represents alkyl having 1 to 6 carbon atoms, cycloalkyl having 3 to 10 carbon atoms or aromatic group optionally substituted, or $P^8$ and $P^9$ bond to form 2-oxocycloalkyl together with the adjacent —CHCO—.

<2> The composition according to <1>, wherein the content of the nitrogen containing compound of the formula (VIa) or (VIb), the content of the resin, and the content of the acid generator are 0.01 to 1% by weight, 80 to 99.89% by weight and 0.1 to 19.99% by weight respectively, based on the total solid content of the composition.

<3> The composition according to <1> or <2>, wherein the nitrogen containing compound is a compound of the formula (IIa) or (IIb)

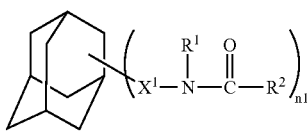

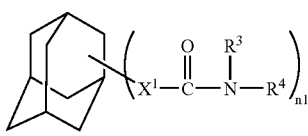

wherein $X^1$ represents alkylene having 1 to 4 carbon atoms or a single bond, $R^1$, $R^3$ and $R^4$ each independently represent hydrogen, alkyl having 1 to 12 carbon atoms, cycloalkyl having 3 to 12 carbon atoms, haloalkyl having 1 to 12 carbon atoms, alkyl having 2 to 12 carbon atoms in which at least one —$CH_2$— other than that binding to the adjacent group is substituted by —S— or —O—, alkoxy having 1 to 12 carbon atoms, or aromatic hydrocarbon group optionally substituted, $R^2$ represents hydrogen, alkyl having 1 to 12 carbon atoms, cycloalkyl having 3 to 12 carbon atoms, haloalkyl having 1 to 12 carbon atoms, alkyl having 2 to 12 carbon atoms in which at least one —$CH_2$— other than that binding to the adjacent group is substituted by —S— or —O—, alkoxy having 1 to 12 carbon atoms, aromatic hydrocarbon group optionally substituted, or arylamino optionally substituted, and $n_1$ denotes integer of 1 to 5, with the proviso that when $n_1$ is 2 or more, each of —$X^1$—$NR^1$—CO—$R^2$ in the formula (IIa) or each of —$X^1$—CO—$NR^3R^4$ in the formula (IIb) may be different.

<4> The composition according to <1> or <2>, wherein the nitrogen containing compound is a compound of the formula (IIIa) or (IIIb)

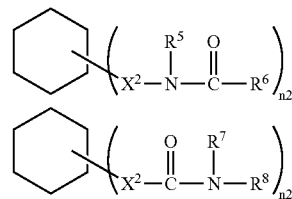

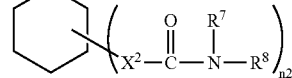

wherein $X^2$ represents alkylene having 1 to 4 carbon atoms or a single bond, $R^5$, $R^7$ and $R^8$ each independently represent hydrogen, alkyl having 1 to 12 carbon atoms, cycloalkyl having 3 to 12 carbon atoms, haloalkyl having 1 to 12 carbon atoms, alkyl having 2 to 12 carbon atoms in which at least one —$CH_2$— other than that binding to the adjacent group is substituted by —S— or —O—, alkoxy having 1 to 12 carbon atoms, or aromatic hydrocarbon group optionally substituted, $R^6$ represent hydrogen, alkyl having 1 to 12 carbon atoms, cycloalkyl having 3 to 12 carbon atoms, haloalkyl having 1 to 12 carbon atoms, alkyl having 2 to 12 carbon atoms in which at least one —$CH_2$— other than that binding to the adjacent group is substituted by —S— or —O—, alkoxy having 1 to 12 carbon atoms, aromatic hydrocarbon group optionally substituted, or arylamino optionally substituted, and $n_2$ denotes integer of 1 to 5, with the proviso that when $n_2$ is 2 or more, each of —$X^2$—$NR^5$—CO—$R^6$ in the formula (IIIa) or each of —$X^2$—CO—$NR^7R^8$ in the formula (IIIb) may be different.

<5> The composition according to any one of <1> to <4>, wherein the content of the structural unit having an acid labile group is 10 to 80% by weight in the total structural units of the resin.

<6> The composition according to any one of <1> to <5>, wherein the structural unit having an acid-labile group is a structural unit derived from 2-alkyl-2-adamantyl (meth)acrylate or 1-(1-adamantyl)-1-alkylalkyl (meth)acrylate.

<7> The composition according to any one of <1> to <6>, wherein the resin contains, in addition to the structural unit having the acid-labile group, further at least one structural unit selected from the group consisting of a structural unit derived from 3-hydroxy-1-adamantyl (meth)acrylate, a structural unit derived from 3,5-dihydroxyl-adamantyl (meth)acrylate, a structural unit derived from (meth)acryloyloxy-γ-butyrolactone having a lactone ring optionally substituted by alkyl, a structural unit of the formula (IVa) and a structural unit of the following formula (IVb)

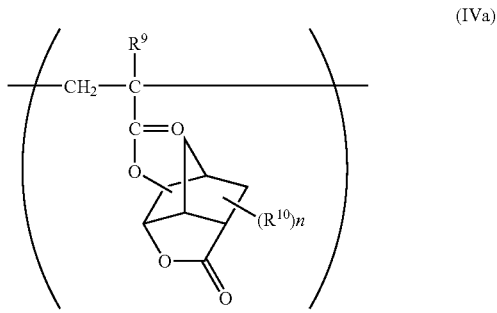

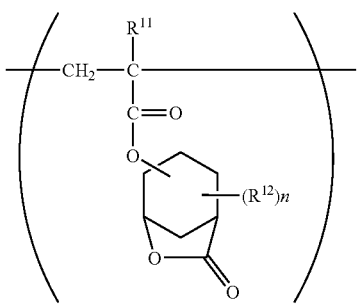
(IVb)

wherein $R^9$, $R^{10}$, $R^{11}$ and $R^{12}$ each independently represent hydrogen or methyl, and n represents an integer of 1 to 3, with the proviso that when n is more than 1, each of the plurality of $R^{10}$ or $R^{12}$ may be different.

<8> The composition according to any one of <1> to <7>, wherein the resin further contains a structural unit derived from 2-norbornene and a structural unit derived from an aliphatic unsaturated dicarboxylic anhydride.

<9> The composition according to <8>, wherein the structural unit derived from 2-norbornene is a structural unit of the formula (VII);

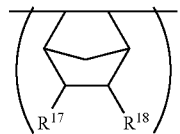
(VII)

wherein $R^{17}$ and $R^{18}$ each independently represent hydrogen, alkyl having 1 to 3 carbon atoms, hydroxyalkyl having 1 to 3 carbon atoms, carboxyl, cyano or —COOZ group in which Z represents alcohol residue, or $R^{17}$ and $R^{18}$ bond together to form a carboxylic anhydride residue represented by —C(=O)OC(=O)—, and the structural unit derived from the aliphatic unsaturated dicarboxylic anhydride is at least one structural unit selected from the group consisting of the formulae (VII) and (IX)

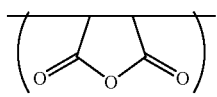
(VIII)

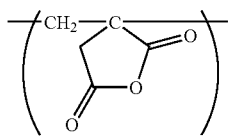
(IX)

<10> The composition according to any one of <1> to <9>, which further comprises a surfactant.

DESCRIPTION OF PREFERRED EMBODIMENTS

The present composition comprises
(1) a nitrogen containing compound of the formula (VIa) or (VIb), which is hereinafter referred to as "Compound (VI)",
(2) resin which contains a structural unit having an acid labile group and which itself is insoluble or poorly soluble in an alkali aqueous solution but becomes soluble in an alkali aqueous solution by the action of an acid, and
(3) an acid generator of the formula (I).

In the formula (VIa) or (VIb), A represents an alicyclic hydrocarbon group which may optionally be substituted Examples of A include 1-adamantyl, 2-adamantyl, 2-methyl-2-adamantyl, 3,5,7-trimethyl-1-adamantyl, cyclohexyl, norbornyl, cyclooctyl, and the like.

X represents alkylene having 1 to 4 carbon atoms or a single bond. The alkylene may be unbranched or branched. Examples of the alkylene include methylene, ethylene, propylene, 1-methylethylene, 2-methyl-ethylene, butylenes, 1,1-dimethylethylene, 2,2-dimethylethylene, 1,2-dimethylethylene, and the like.

$R^{13}$, $R^{15}$ and $R^{16}$ each independently represent hydrogen, alkyl having 1 to 12 carbon atoms such as methyl, ethyl, propyl, isopropyl, butyl, tert-butyl, pentyl, hexyl, octyl, decyl, dodecyl, and the like; cycloalkyl having 3 to 12 carbon atoms such as cyclohexyl, cyclooctyl, norbornyl, adamantyl, and the like; haloalkyl having 1 to 12 carbon atoms such as trifluoromethyl, perfluorobutyl, perfluorooctyl; alkyl having 2 to 12 carbon atoms in which at least one —CH$_2$— other than that binding to the adjacent group is substituted by —S— or —O— such as alkoxyalkyl (e.g. methoxymethyl, ethoxyethyl, propoxymethyl, and butoxyethyl); alkoxy having 1 to 12 carbon atoms such as methoxy, ethoxy, propoxy, butoxy, and the like; or aromatic hydrocarbon group optionally substituted such as phenyl, tolyl, naphtyl, methoxyphenyl, benzyl, and the like.

$R^{14}$ represent hydrogen, alkyl having 1 to 12 carbon atoms, cycloalkyl having 3 to 12 carbon atoms, haloalkyl having 1 to 12 carbon atoms, alkyl having 2 to 12 carbon atoms in which at least one —CH$_2$— other than that binding to the adjacent group is substituted by —S— or —O—, alkoxy having 1 to 12 carbon atoms, aromatic hydrocarbon group optionally substituted, or arylamino usually having 6 to 12 carbon atoms optionally substituted. Examples of $R^{14}$ except arylamino having to carbon atoms include the same as exemplified in $R^{13}$, $R^{14}$ and $R^{15}$ above. Examples of arylamino having 6 to 12 carbon atoms optionally substituted include phenylamino, p-methylphenylamino, m-methylphenylamino, 2,4,6-trimethylphenylamino, p-methoxyphenylamino, o-methoxyphenylamino, o-nitrophenylamino, m-nitrophenylamino, 2-methyl-5-nitrophenylamino, 1-naphtylamino, and the like.

n represents an integer of 1 to 5. When n is 2 or more, each of —X—NR$^{13}$—CO—R$^{14}$ in the formula (VIa) or each of —X—CO—NR$^{15}$R$^{16}$ in the formula (VIb) may be identical or different.

Compound (VI) may preferably be a compound represented by the one selected from the group consisting of the formulae (IIa) and (IIb).

In the formula (IIa) or (IIb), $X^1$ represents alkylene having 1 to 4 carbon atoms or a single bond, $R^1$, $R^3$ and $R^4$ each independently represent hydrogen, alkyl having 1 to 12 carbon atoms, cycloalkyl having 3 to 12 carbon atoms, haloalkyl having 1 to 12 carbon atoms, alkyl having 2 to 12 carbon atoms in which at least one —CH$_2$— other than that binding to the adjacent group is substituted by —S— or —O—, alkoxy having 1 to 12 carbon atoms, or aromatic group optionally substituted, $R^2$ represent hydrogen, alkyl having 1 to 12 carbon atoms, cycloalkyl having 3 to 12 carbon atoms, haloalkyl having 1 to 12 carbon atoms, alkyl having 2 to 12 carbon atoms in which at least one —CH$_2$— other than that binding to the adjacent group is substituted by —S— or —O—, alkoxy having 1 to 12 carbon atoms, aromatic hydrocarbon group optionally substituted, or arylamino optionally substituted, and $n_1$ denotes integer of 1 to 5, with the proviso that when $n_1$ is 2 or more, each of —$X^1$—$NR^1$—CO—$R^2$ in the formula (IIa) or each of —$X^1$—CO—$NR^3R^4$ in the formula (IIb) may be different. Examples of $X^1$, $R^1$, $R^2$, $R^3$ and $R^4$ include the same as exemplified in X, $R^{13}$, $R^{14}$, $R^{15}$ and $R^{16}$ in the formula (VIa) and (VIb). $n_1$ has the same meaning as in n in the formula (VIa) and (VIb).

Compound (VI) may also preferably be a compound represented by the one selected from the group consisting of the formulae (IIIa) and (IIIb).

In the formula (IIa) or (IIIb), $X^2$ represents alkylene having 1 to 4 carbon atoms or a single bond, $R^5$, $R^7$ and $R^8$ each independently represent hydrogen, alkyl having 1 to 12 carbon atoms, cycloalkyl having 3 to 12 carbon atoms, haloalkyl having 1 to 12 carbon atoms, alkyl having 2 to 12 carbon atoms in which at least one —CH$_2$— other than that binding to the adjacent group is substituted by —S— or —O—, alkoxy having 1 to 12 carbon atoms, or aromatic hydrocarbon group optionally substituted, $R^6$ represent hydrogen, alkyl having 1 to 12 carbon atoms, cycloalkyl having 3 to 12 carbon atoms, haloalkyl having 1 to 12 carbon atoms, alkyl having 2 to 12 carbon atoms in which at least one —CH$_2$— other than that binding to the adjacent group is substituted by —S— or —O—, alkoxy having 1 to 12 carbon atoms, aromatic hydrocarbon group optionally substituted, or arylamino optionally substituted, and $n_2$ denotes integer of 1 to 5, with the proviso that when $n_2$ is 2 or more, each of —$X^2$—$NR^5$—CO—$R^6$ in the formula (IIIa) or each of —$X^2$—CO—$NR^7R^8$ in the formula (IIIb) may be different. Examples of $X^2$, $R^5$, $R^6$, $R^7$ and $R^8$ include the same as exemplified in X, $R^{13}$, $R^{14}$, $R^{15}$ and $R^{16}$ in the formula (VIa) and (VIb). $n_2$ has the same meaning as in n in the formula (VIa) and (VIb).

Specific examples of the nitrogen containing compound of the formula (IIa) or (IIb) include the followings:

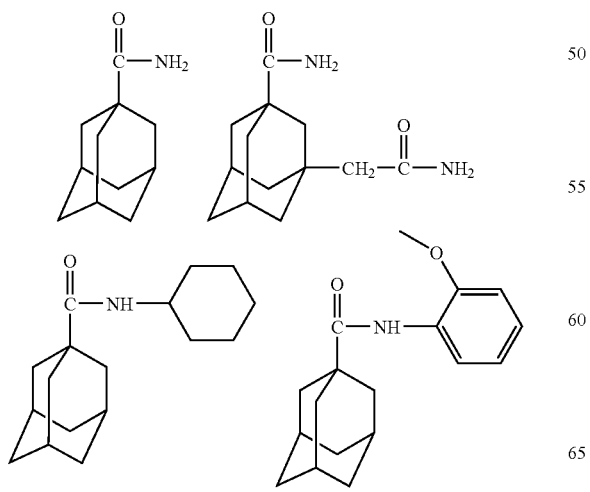

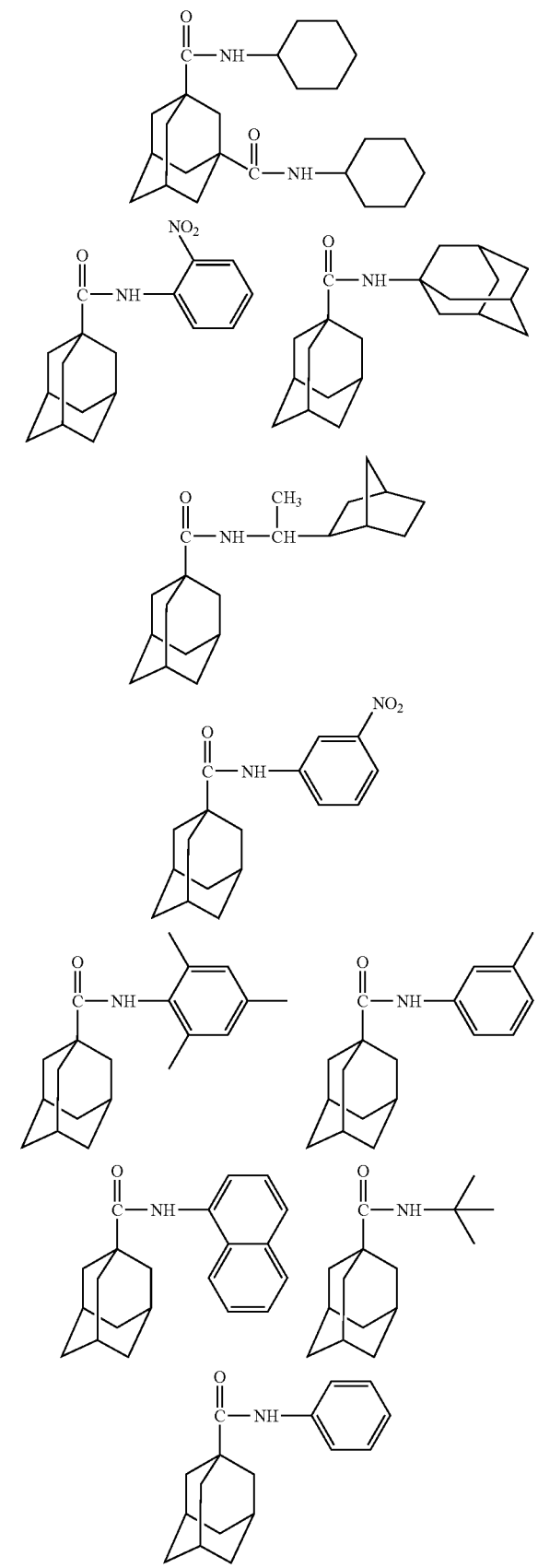

-continued
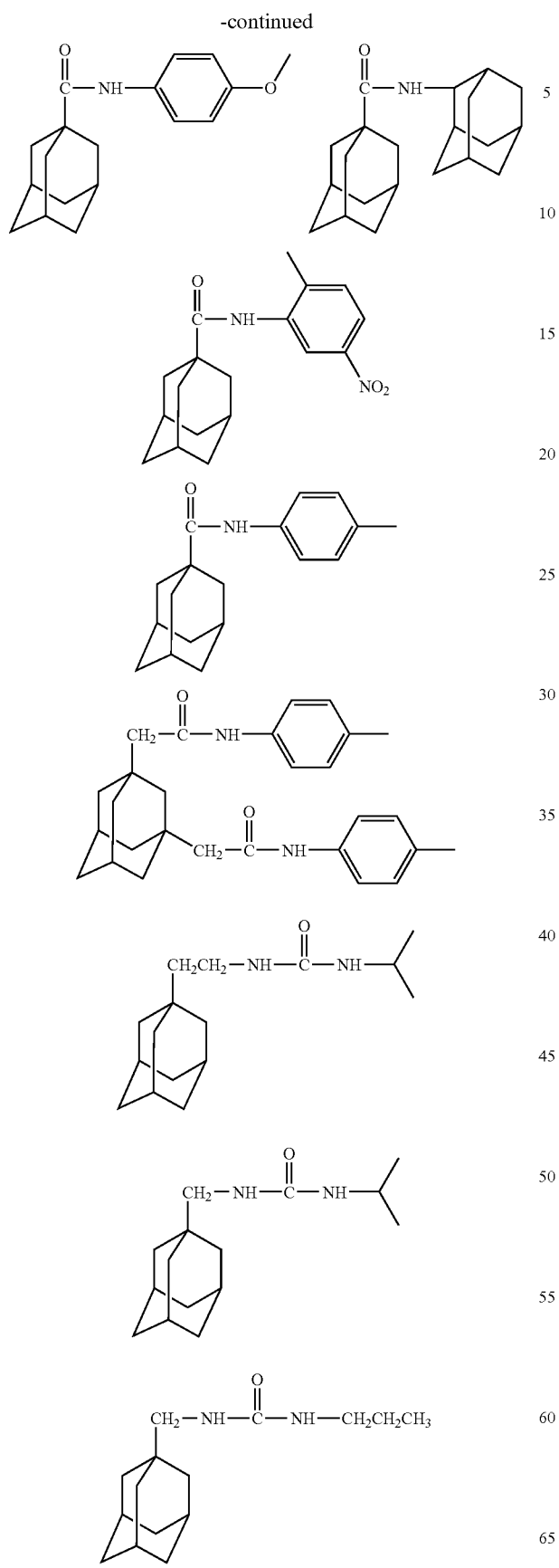
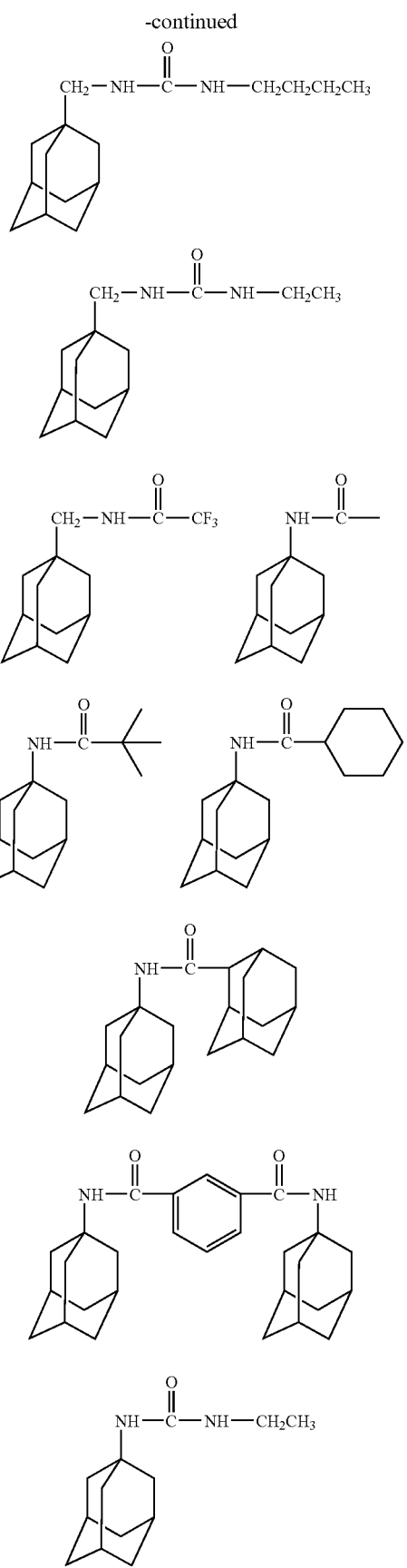

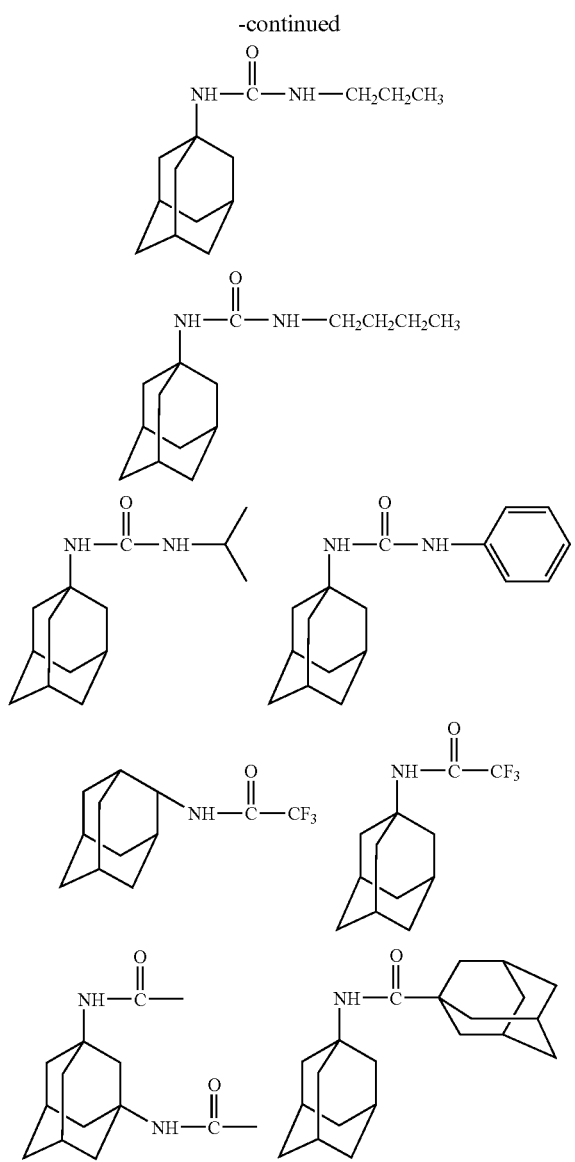
Specific examples of the nitrogen containing compound of the formula (IIIa) or (IIIb) include the followings:
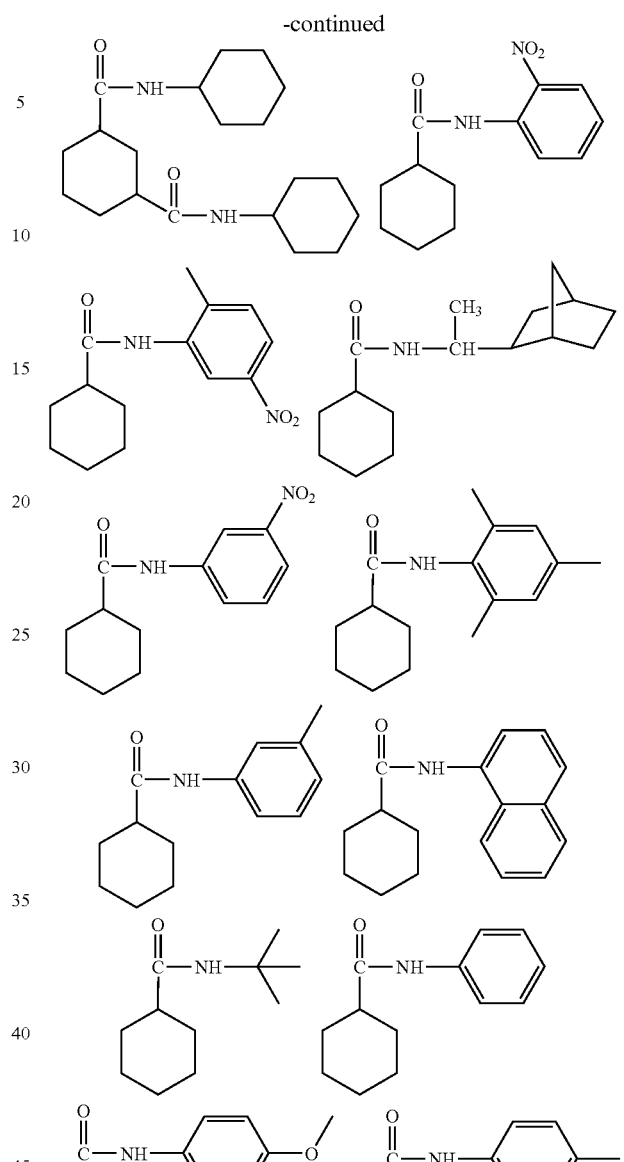
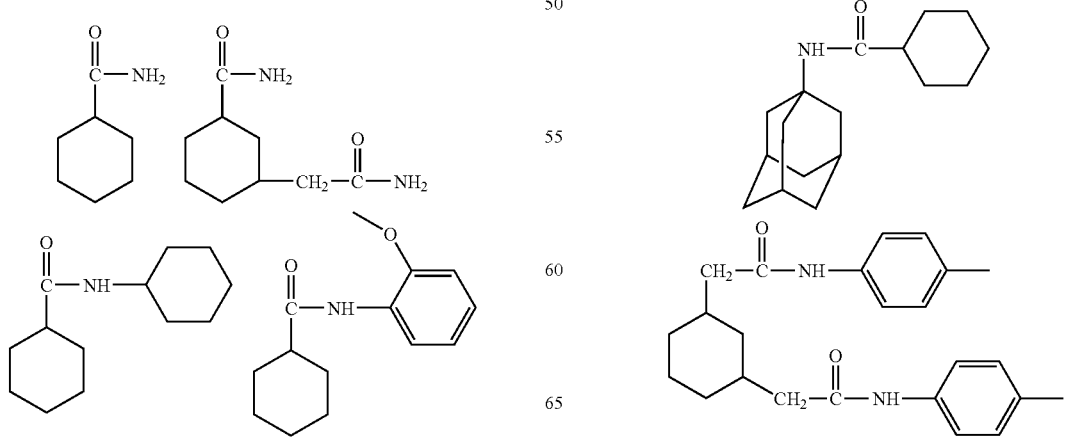

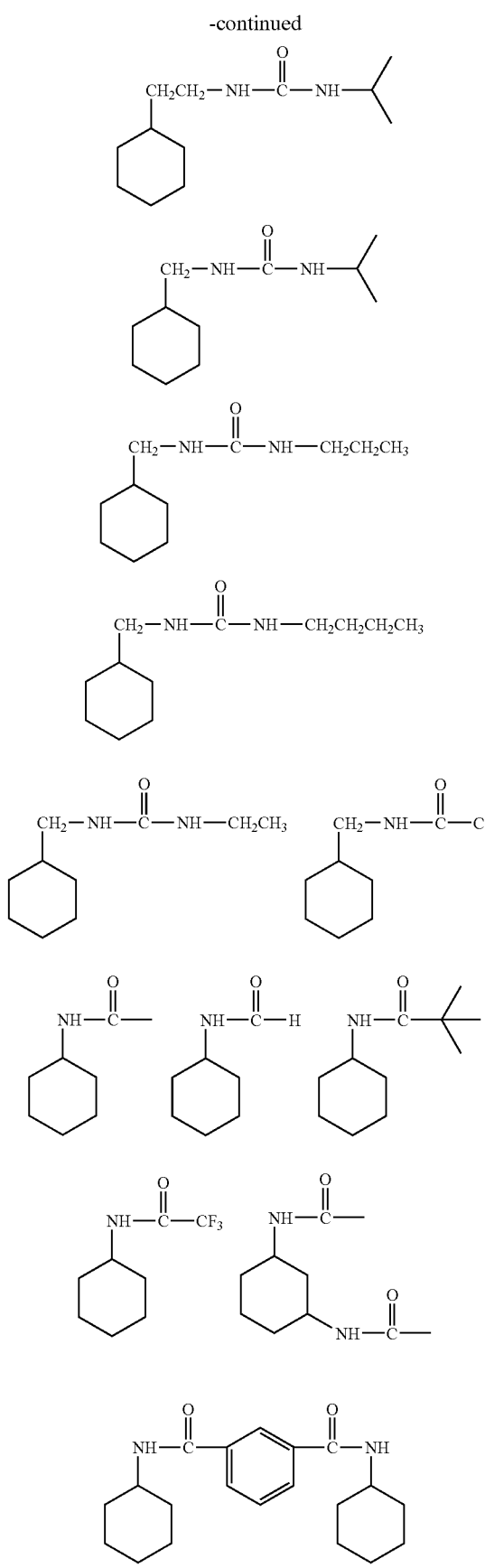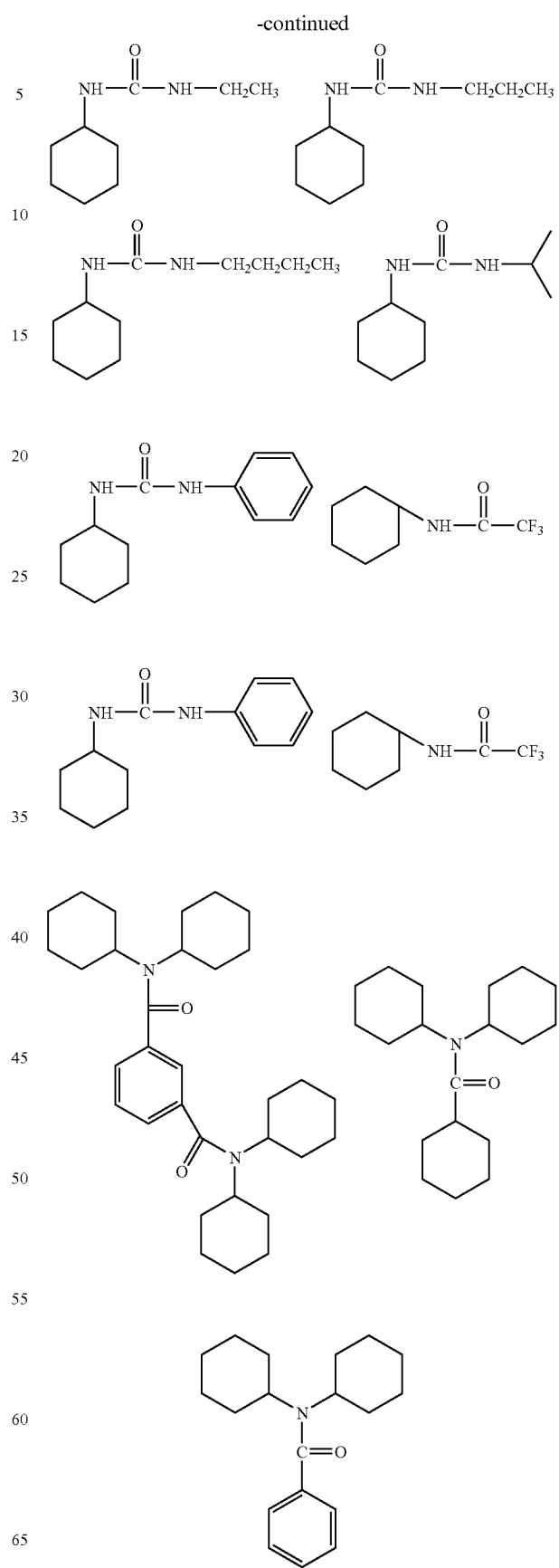

Specific examples of the nitrogen containing compound other than the formula (IIa), (IIb), (IIIa) or (IIIb) include the followings:

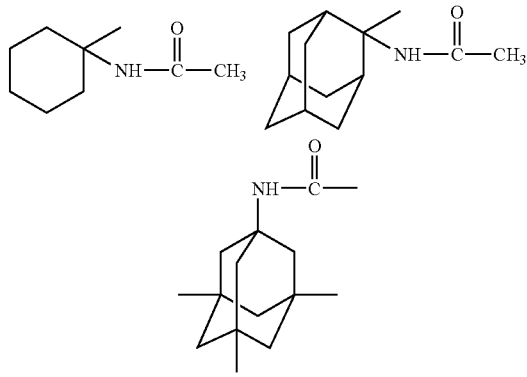

In the present invention, two or more kind of Compound (VI) may be used together, if necessary.

Next, resin components constituting the present composition will be explained. The resin used in the present composition contains a structural unit having an acid-labile group and the resin is insoluble or poorly soluble itself in alkali aqueous solution and shows partial dissociation of groups by the action of an acid to become soluble in alkali aqueous solution after the dissociation. The acid-labile group can be selected from conventionally known various groups.

Specific examples of such group include tert-butyl; a group in which a quaternary carbon bonds to oxygen atom such as tert-butoxycarbonyl, tert-butoxycarbonylmethyl, and the like, an acetal type group such as tetrahydro-2-pyranyl, tetrahydro-2-furyl, 1-ethoxyethyl, 1-(2-methylpropoxy)ethyl, 1-(2-methoxyethoxy)ethyl, 1-(2-acetoxyethoxy)ethyl, [2-(1-adamantyloxy)ethoxy]ethyl, 1-[2-(1-adamantanecarbonyloxy)ethoxy]ethyl, and the like; a residue of alicyclic compound such as 3-oxocyclohexyl, 4-methyltetrahydro-2-pyron4-yl, which is introduced from mevalonic lactone, 2-methyl-2-adamantyl, 2-ethyl-2-adamantyl, and the like.

Hydrogen of phenolic hydroxyl or of carboxyl in the resin is substituted with the acid-labile group. The acid-labile group can be introduced into alkali soluble resin having phenolic hydroxyl or carboxyl by any conventional substituent introduction reaction to obtain the resin used in the present composition. The resin used in the present composition can also be obtained by copolymerization of an unsaturated compound having the acid-labile group above as one of monomers.

Among the above-mentioned monomers, it is preferable to use those having a bulky group containing alicyclic group such as, for example, 2-alkyl-2-adamantyl and 1-(1-adamantyl)-1-alkylalkyl, as the group dissociated by the action of an acid, since excellent resolution is obtained when used in the present composition.

Examples of such monomer containing a bulky group include 2-alkyl-2-adamantyl (meth)acrylate, 1-(1-adamantyl)-1-alkylalkyl (meth)acrylate, 2-alkyl-2-adamantyl 5-norbornene-2-carboxylate, 1-(1-adamantyl)-1-alkylalkyl 5-norbornene-2-carboxylate, and the like.

Particularly when 2-alkyl-2-adamantyl (meth)acrylate is used as the monomer for the resin component in the present compositions excellent resolution is obtained. Typical examples of such 2-alkyl-2-adamantyl (meth)acrylate include 2-methyl-2-adamantyl acrylate, 2-methyl-2-adamantyl methacrylate, 2-ethyl-2-adamantyl acrylate, 2-ethyl-2-adamantyl methacrylate, 2-n-butyl-2-adamantyl acrylate, and the like. When particularly 2-ethyl-2-adamantyl (meth)acrylate is used for the present composition, balance between sensitivity and heat resistance is excellent. In the present invention, two or more kind of monomers having group dissociated by the action of an acid may be used together, if necessary.

2-Alkyl-2-adamantyl (meth)acrylate can usually be produced by reacting 2-alkyl-2-adamantanol or metal salt thereof with an acrylic halide or methacrylic halide.

The resin used for the present composition can also contain, in addition to the above-mentioned structural units having an acid-labile group, other structural units not dissociated or not easily dissociated by the action of an acid. Examples of such other structural units which can be contained include structural units derived from monomers having a free carboxyl group such as acrylic acid and methacrylic acid, structural units derived from aliphatic unsaturated dicarboxylic anhydrides such as maleic anhydride and itaconic anhydride, structural unit derived from 2-norbornene, structural unit derived from (meth)acrylonitrile, structural unit derived from other (meth)acrylates above, and the like.

In the case of KrF exposure, there is no problem on light absorption, and a structural unit derived from hydroxystyrene can be further contained.

Particularly, to contain, in addition to the structural unit having an acid-labile group, further at least one structural unit selected from the group consisting of a structural At derived from 3-hydroxy-1-adamantyl (meth)acrylate, a structural unit derived from 3,5-dihydroxy-1-adamantyl (meth)acrylate, a structural unit derived from (meth)acryloyloxy-γ-butyrolactone optionally substituted by alkyl, a structural unit of the following formula (IVa) and a structural unit of the following formula (IVb), in the resin in the present composition, is preferable from the standpoint of the adhesiveness of resist to a substrate.

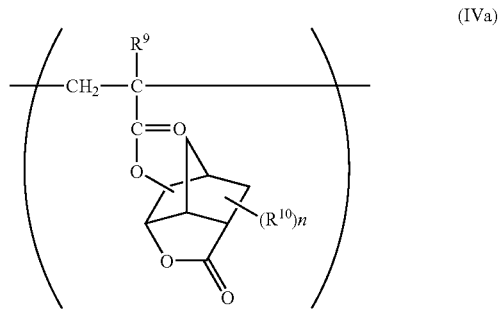

(IVa)

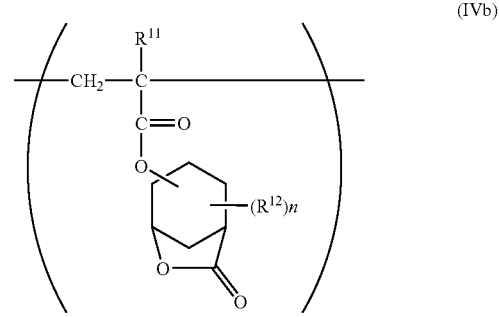

(IVb)

In the formulae (IVa) and (IVb), $R^9$, $R^{10}$, $R^{11}$ and $R^{12}$ each independently represent hydrogen or methyl, and n represents an integer of 1 to 3, with the proviso that when n is more than 1, each of the plurality of $R^{10}$ or $R^{12}$ may be identical or different.

3-Hydroxy-1-adamantyl (meth)acrylate and 3,5-dihydroxy-1-adamantyl (meth)acrylate can be produced, for example, by reacting corresponding hydroxyadamantane with (meth)acrylic acid or its acid halide, and they are also commercially available.

Further, (meth)acryloyloxy-γ-butyrolactone can be produced by reacting α- or β-bromo-γ-butyrolactone having a lactone ring optionally substituted by allyl with acrylic acid or methacrylic acid, or reacting α- or β-bromo-γ-butyrolactone having a lactone ring optionally substituted by alkyl with acrylic halide or methacrylic halide.

As monomers to be derived into structural units of the formulae (IVa) and (IVb), specifically listed are, for example, (meth)acrylates of alicyclic lactones having hydroxyl described below, and mixtures thereof, and the like. These esters can be produced, for example, by reacting corresponding alicyclic lactone having hydroxyl with (meth) acrylic acids, and the production method thereof is described in, for example, JP2000-26446-A.

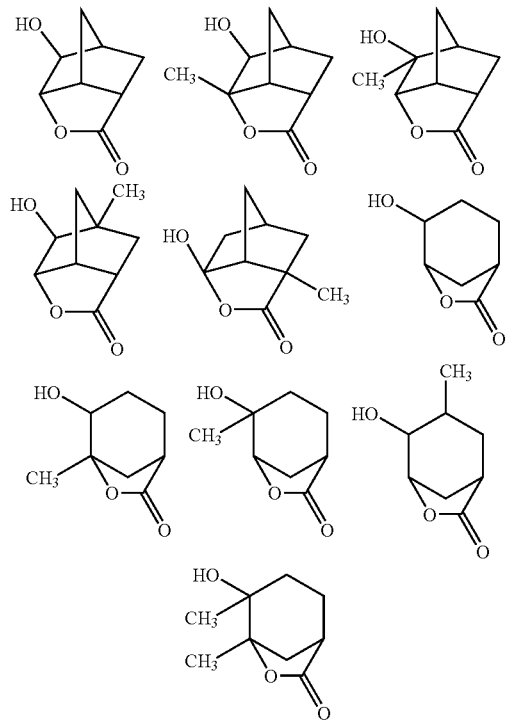

When any of the structural unit derived from 3-hydroxy-1-adamantyl (meth)acrylate, the structural unit derived from 3,5-dihydroxy-1-adamantyl (meth)acrylate, the structural unit derived from a meth)acryloyloxy-γ-butyrolactone, the structural unit derived from β-(meth)acryloyloxy-γ-butyrolactone and the structural unit of the formulae (VIIa) and (VIIb) is contained in the resin, not only the adhesiveness of the resist to a substrate is improved, but also the resolution of the resist is improved.

Here, examples of the (meth)acryloyloxy-γ-butyrolactone include α-acryloyloxy-γ-butyrolactone, α-methacryloyloxy-γ-butyrolactone, α-acryloyloxy-β, β-dimethyl-γ-butyrolactone, α-methacryloyloxy-β, β-dimethyl-γ-butyrolactone, α-acryloyloxy-α-methyl-γ-butyrolactone, α-methacryloyloxy-α-methyl-γ-butyrolactone, β-acryloyloxy-γ-butyrolactone, β-methacryloyloxy-γ-butyrolactone, β-methacryloyloxy-α-methyl-γ-butyrolactone and the like.

In these cases, it is advantageous from the standpoint of dry etching resistance to contain 2-alkyl-2-adamantyl or 1-(1-adamantyl)-1-alkylalkyl as the acid labile group in the resin.

The resin containing a structural unit derived from 2-norbornene shows strong structure because of alicyclic group directly present on its main chain and shows a property that dry etching resistance is excellent. The structural unit derived from 2-norbornene can be introduced into the main chain by radical polymerization using, for example, in addition to corresponding 2-norbornene, aliphatic unsaturated dicarboxylic anhydrides such as maleic anhydride and itaconic anhydride together. The structural unit derived from 2-norbornene is formed by opening of its double bond, and can be represented by the formula (VII). The structural unit derived from maleic anhydride and the structural unit derived from itaconic anhydride which are the structural unit derived from aliphatic unsaturated dicarboxylic anhydrides are formed by opening of their double bonds, and can be represented by the formula (VIII) and the formula (IX), respectively.

 (VII)

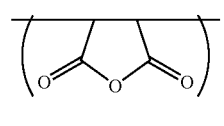 (VIII)

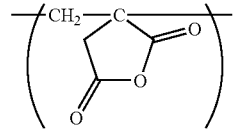 (IX)

Here, $R^{17}$ and $R^{18}$ in the formula (VII) each independently represent hydrogen, alkyl having 1 to 3 carbon atoms, hydroxyalkyl having 1 to 3 carbon atoms, carboxyl, cyano or —COOZ group in which Z represents alcohol residue, or $R^{17}$ and $R^{18}$ can bond together to form a carboxylic anhydride residue represented by —C(=O)OC(=O)—.

In $R^{17}$ and $R^{18}$, examples of the alkyl include methyl, ethyl, propyl and isopropyl, specific examples of hydroxyalkyl include hydroxymethyl, 2-hydroxyethyl and the like.

In $R^{17}$ and $R^{18}$, —COOZ group is an ester formed from carboxyl, and as the alcohol residue corresponding to Z, for example, optionally substituted alkyls having about 1 to 8 carbon atoms, 2-oxooxolan-3- or -4-yl and the like are listed, and as the substituent on the alkyl hydroxyl, alicyclic hydrocarbon residues and the like are listed.

Specific examples of —COOZ include methoxycarbonyl, ethoxycarbonyl, 2-hydroxyethoxycarbonyl, tert-butoxycarbony, 2-oxooxalan-3-yloxycarbonyl, 2-oxooxalan-4-yloxycarbonyl, 1,1,2-trimethylpropoxycarbonyl, 1-cyclohexyl-1-methylethoxycarbonyl, 1-(4-methylcyclohexyl)-1-methylethoxycarbonyl, 1-(1-adamantyl)-1-methylethoxycarbonyl and the like.

Specific examples of the monomer used to derive the structural unit represented by the formula (VII) may include the followings;
2-norbornene,
2-hydroxy-5-norbornene,
5-norbornene-2-carboxylic acid,
methyl 5-norbornene-2-carboxylate,
tert-butyl 5-norbornene-2-carboxylate,
1-cyclohexyl-1-methylethyl 5-norbornene-2-carboxylate,
1-(4-methylcyclohexyl)-1-methylethyl 5-norbornene-2-carboxylate,
1-(4-hydroxycyclohexyl)-1-methylethyl 5-norbornene-2-carboxylate,
1-methyl-1-(4oxocyclohexyl)ethyl 5-norbornene-2-carboxylate,
1-(1-adamantyl)-1-methylethyl 5-norbornene-2-carboxylate,
1-methylcyclohexyl 5-norbornene-2-carboxylate,
2-methyl-2-adamantyl 5-norbornene-2-carboxylate,
2-ethyl-2-adamantyl 5-norbornene-2-carboxylate,
2-hydroxyethyl 5-norbornene-2-carboxylate,
5-norbornene-2-methanol,
5-norbornene-2,3-dicarboxylic acid anhydride, and the like.

The resin used in the present composition preferably contains structural unit(s) having an acid-labile group generally in a ratio of 10 to 80% by mol in all structural units of the resin though the ratio varies depending on the kind of radiation for patterning exposure, the kind of an acid-labile group, and the like.

When the structural units particularly derived from 2-alkyl-2-adamantyl (meth)acrylate or 1-(1-adamantyl)-1-alkylalkyl (meth)acrylate are used as the acid-labile group, it is advantageous that the ratio of the structural units is 15% by mol or more in all structural units of the resin.

When, in addition to structural units having an acid-labile group, other structural units not easily dissociated by the action of an acid, for example, a structural unit derived from 3hydroxy-1-adamantyl (meth)acrylate, a structural units derived from 3,5-dihydroxy-1-adamantyl (meth)acrylate or α-(meth)acryloyloxy-γ-butyrolactone, a structural units derived from β-(meth)acryloyloxy-γ-butyrolactone, a structural unit of the formula (IVa) or (IVb), a structural unit derived from hydroxystyrene, a structural unit of the formula (VII), a structural unit derived from maleic anhydride of the formula (VIII) which is a structural unit derived from an aliphatic unsaturated dicarboxylic anhydride, a structural unit derived from itaconic anhydride of the formula (IX) and the like are contained, it is preferable that the sum of these structural units is in the range of 20 to 90% by mol based on all structural units of the resin.

When 2-norbornenes and aliphatic unsaturated dicarboxylic anhydride are used as copolymerization monomer, it is preferable to use them in excess amount in view of a tendency that these are not easily polymerized.

The acid generator in the present composition has the formula (I).

In the formula (I), $Q^1$, $Q^2$, $Q^3$, $Q^4$ and $Q^5$ each independently represent hydrogen, hydroxyl, optionally branched alkyl having 1 to 12 carbon atoms, optionally branched alkoxy having 1 to 12 carbon atoms, or electron-withdrawing group, and $Z^+$ represents a group of the formula (Va), (Vb) or (Vc).

Examples of the optionally branched alkyl having 1 to 12 carbon atoms include methyl, ethyl, propyl, isopropyl, butyl, tert-butyl pentyl, hexyl, octyl, decyl, dodecyl, and the like.

Examples of the optionally branched alkoxy having 1 to 12 carbon atoms include methoxy, ethoxy, propoxy, isopropoxy, butoxy, tert-butoxy, pentyloxy, hexyloxy, isopentyloxy, decyloxy, dodecyloxy, and the like.

Examples of the electron-withdrawing group include halogen such as fluorine, chlorine, bromine, and the like; cyano; nitro; carbonyl; sulfonyl; haloalkyl such as perfluoroalkyl (e.g. perfluoromethyl, perfluoroethyl, perfluorobutyl, perfluorooctyl, etc.); and the like.

In the formula (Va), $P^1$, $P^2$ and $P^3$ each independently represent hydrogen, hydroxyl, alkyl having 1 to 6 carbon atoms or alkoxy having 1 to 6 carbon atoms, and the alkyl and alkoxy may be linear or branched in the case of 3 or more carbon atoms.

In the formula (Vb), $P^4$ and $P^5$ each independently represent hydrogen, hydroxyl, alkyl having 1 to 6 carbon atoms or alkoxy having 1 to 6 carbon atoms, and the alkyl and alkoxy may be linear or branched in the case of 3 or more carbon atoms.

In $P^1$, $P^2$, $P^3$, $P^4$ and $P^5$, specific examples of the alkyl include methyl, ethyl, propyl, isopropyl, butyl, tert-butyl, pentyl, hexyl and the like, and examples of the alkoxy include methoxy, ethoxy, propoxy, butoxy and the like.

In the formula (IIc), $P^6$ and $P^7$ each independently represent alkyl having 1 to 6 carbon atoms or cycloalkyl having 3 to 10 carbon atoms, or $P^6$ and $P^7$ bond to form divalent acyclic hydrocarbon having 3 to 7 carbon atoms which form a rig together with the adjacent $S^+$. At least one —$CH_2$— in the divalent acyclic hydrocarbon may be substituted by —CO—, —O— or —S—.

$P^8$ represents hydrogen and $P^9$ represents alkyl having 1 to 6 carbon atoms, cycloalkyl having 3 to 10 carbon atoms or aromatic ring group optionally substituted, or $P^8$ and $P^9$ bond to form 2-oxocycloalkyl together with the adjacent —CHCO—.

In $P^6$, $P^7$ and $P^9$, specific examples of the alkyl include methyl, ethyl, propyl, isopropyl, butyl, tert-butyl, pentyl, hexyl and the like, and specific examples of the cycloalkyl include cyclopropyl, cyclobutyl, cyclopentyl, cyclohexyl, cycloheptyl and the like. Specific examples of the ring group formed by adjacent $S^+$ and divalent acyclic hydrocarbon by $P^6$ and $P^7$ include pentamethylenesulfonio group, tetramethylenesulfonio group, oxybisethylenesulfonio group, and the like. In $P^9$, specific examples of the aromatic ring group include phenyl, tolyl, xylyl, naphtyl and the like. Specific examples of the 2-oxocycloalkyl formed by bonding $P^8$ and $P^9$ together with the adjacent —CHCO— include 2-oxocyclohexyl, 2-oxocyclopentyl and the like.

Specific examples of anion part of the formula (I) in the acid generator include the followings:

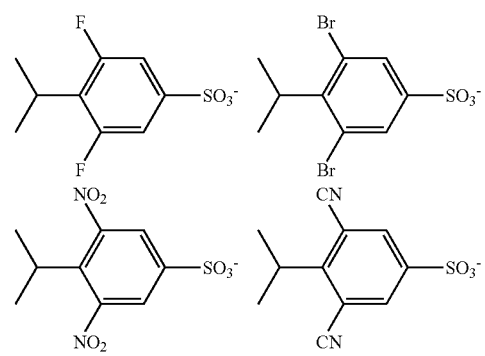

-continued
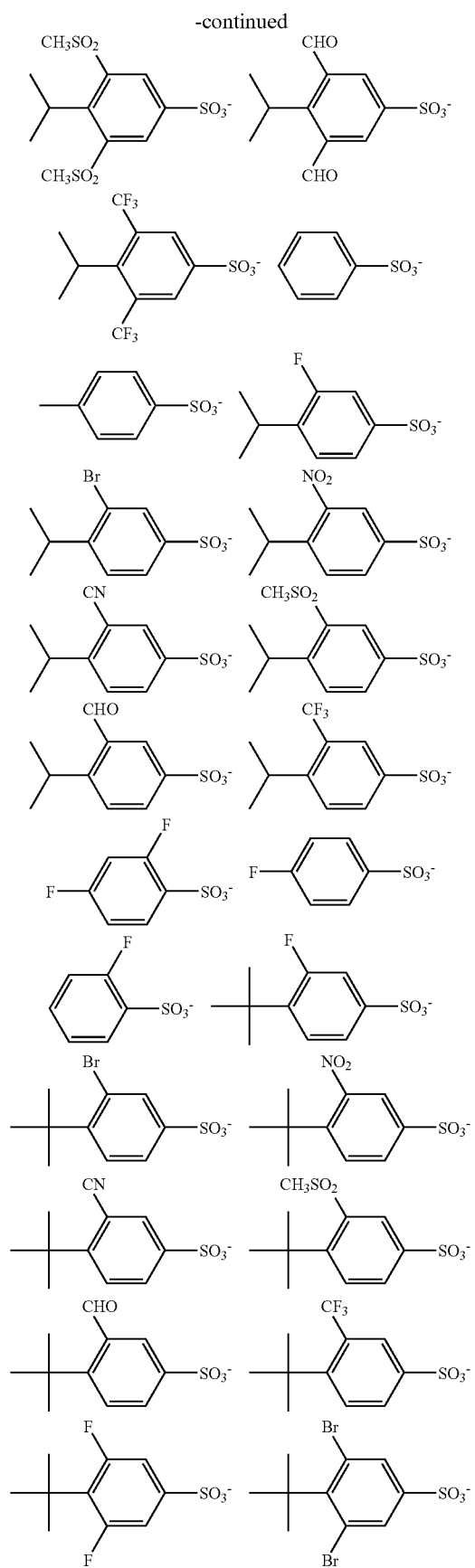
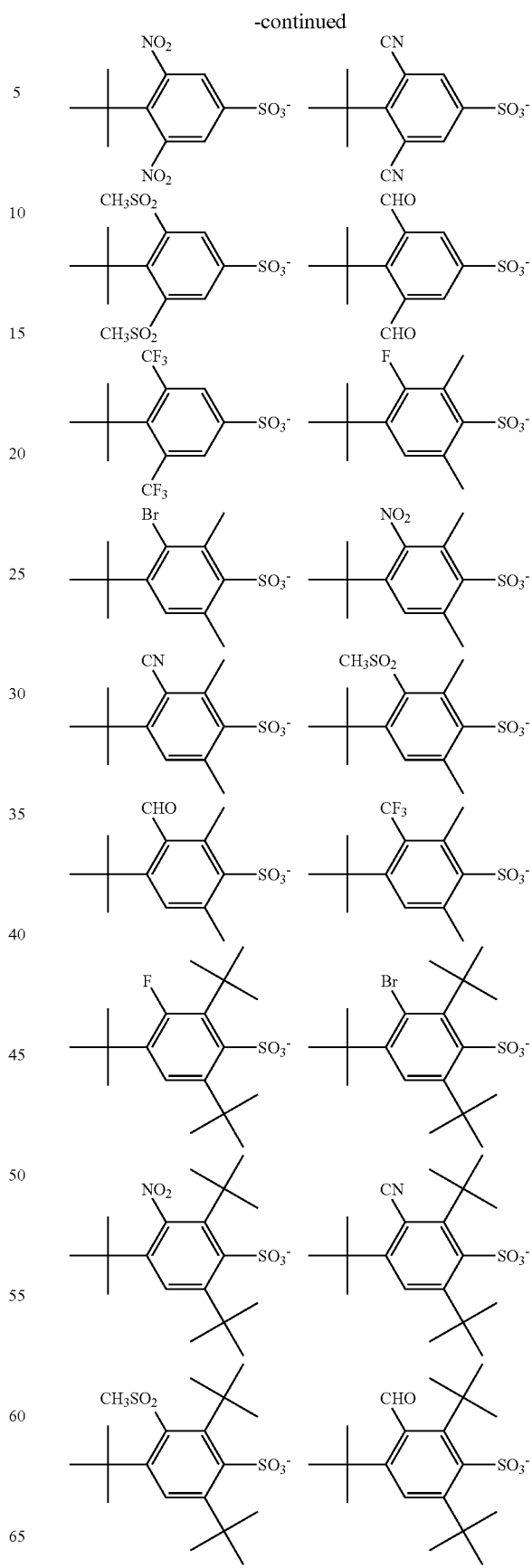

-continued
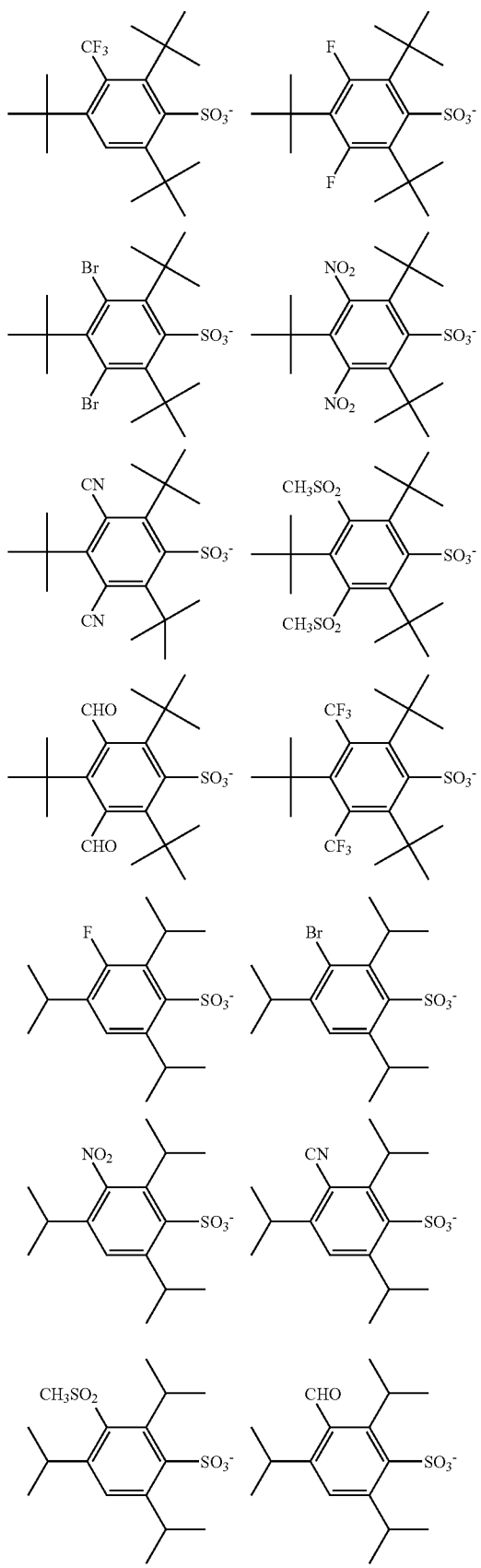
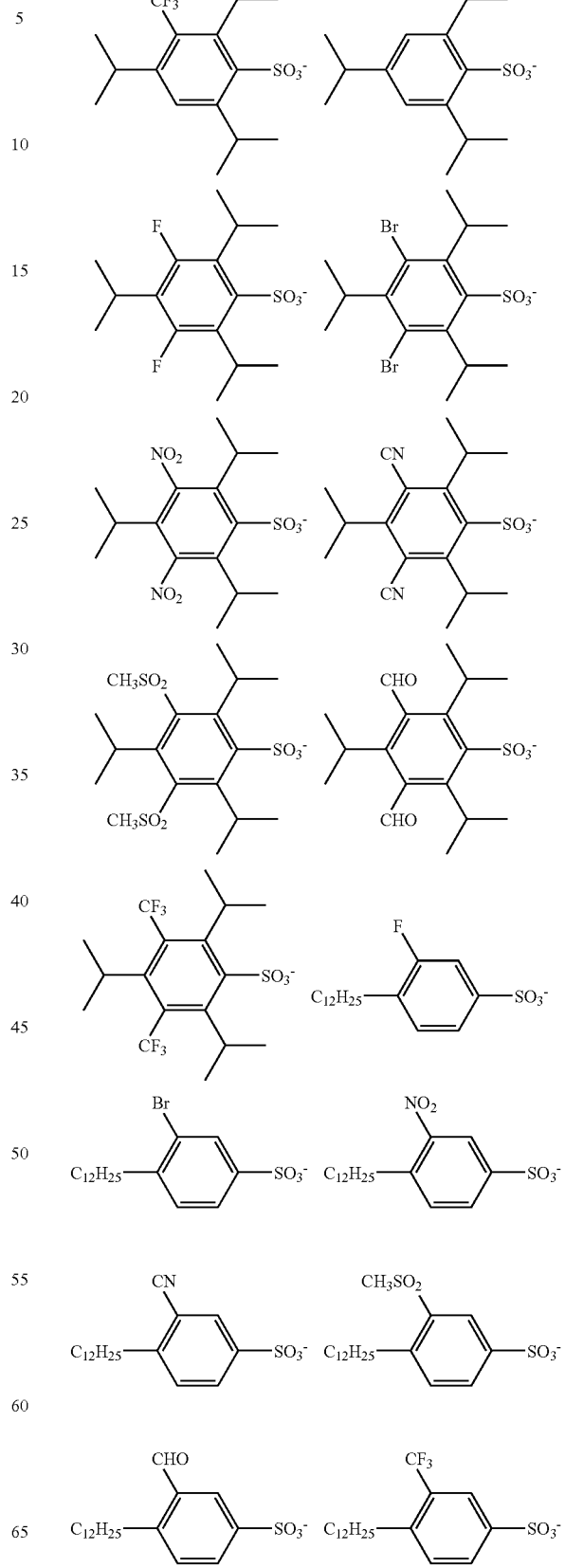

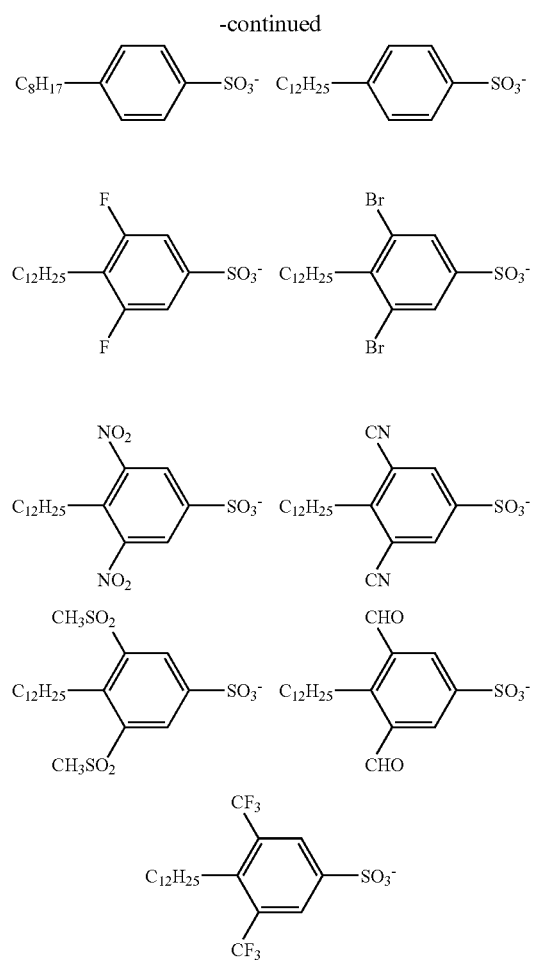
Specific examples of the group of the formulae (Va), (Vb) and (Vc) include the followings:
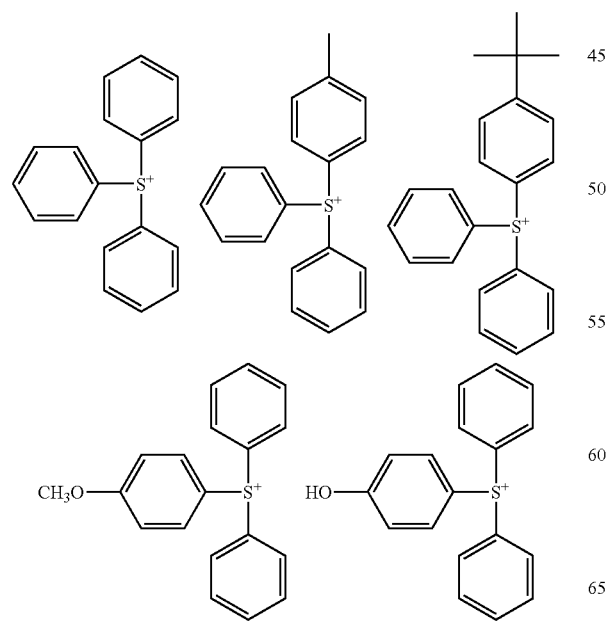
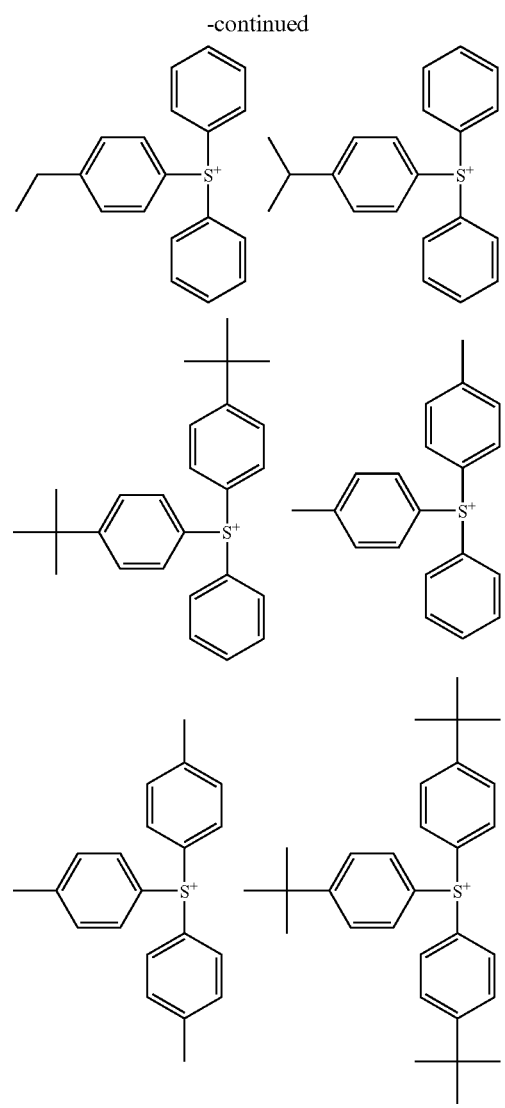
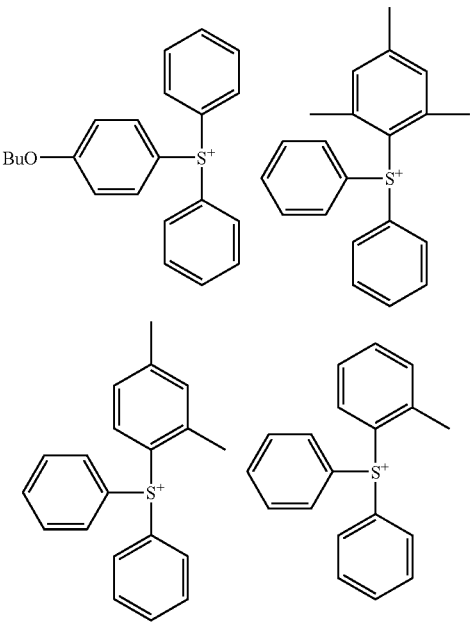

-continued

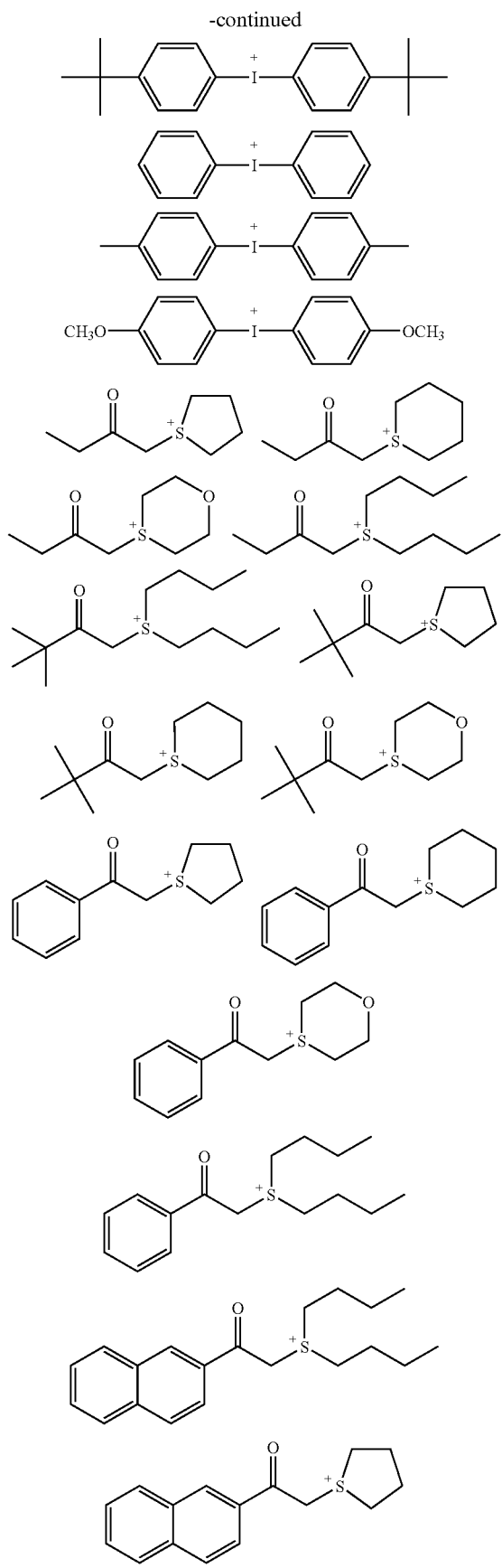

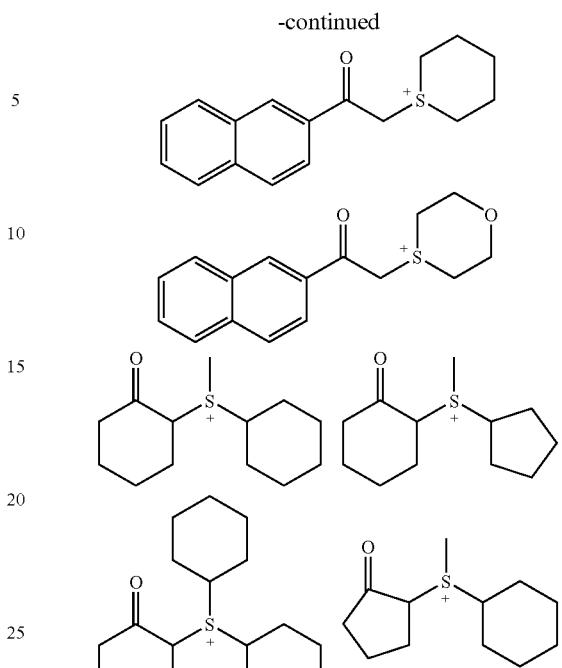

It is preferable that the present composition contains Compound (VI) in an amount of 0.01 to 1% by weight, the resin in an amount of about 80 to 99.89% by weight and the acid generator of the formula (I) in an amount of 0.1 to 19.99% by weight based on the total solid content of the present composition.

It is preferable that Compound (VI) is contained in an amount of about 0.01 to 1% by weight, all based on the total solid content of the present composition.

The present composition can contain, if necessary, various additives in small amount such as a sensitizer, solution suppressing agent, other resins, surfactant, stabilizer, dye and the like, as long as the effect of the present invention is not prevented.

The present composition is usually in the form of a resist liquid composition in which the aforementioned ingredients are dissolved in a solvent, and the resist liquid composition is to be applied onto a substrate such as a silicon wafer by a conventional process such as spin coating. The solvent used here is sufficient to dissolve the aforementioned ingredients, have an adequate drying rate, and give a uniform and smooth coat after evaporation of the solvent and, hence, solvents generally used in the art can be used. In the present invention, the total solid content means total content exclusive of solvents.

Examples thereof include glycol ether esters such as ethylcellosolve acetate, methylcellosolve acetate and propylene glycol monomethyl ether acetate; esters such as ethyl lactate, butyl lactate, amyl lactate and ethyl pyruvate and the like; ketones such as acetone, methyl isobutyl ketone, 2-heptanone and cyclohexanone; cyclic esters such as γ-butyrolactone, and the like. These solvents can be used each alone or in combination of two or more.

A resist film applied onto the substrate and then dried is subjected to exposure for patterning, then heat-treated for facilitating a deblocking reaction, and thereafter developed with an alkali developer. The alkali developer used here may be any one of various alkaline aqueous solutions used in the art, and generally, an aqueous solution of tetramethylammonium hydroxide or (2-hydroxyethyl)trimethylammonium hydroxide (commonly known as "choline") is often used.

The present invention will be described more specifically by way of examples, which are not construed to limit the scope of the present invention. The "%" and "part(s)" used to represent the content of any component and the amount of any material used in the following examples are on a weight basis unless otherwise specifically noted. The weight-average molecular weight of any material used in the following examples is a value found by gel permeation chromatography using styrene as a standard reference material.

NITROGEN CONTAINING COMPOUND SYNTHESIS EXAMPLE 1

Synthesis of Nitrogen Containing Compound D1

2.0 g of 1-adamantanamine was dissolved in 10.0 g of pyridine. The solution was cooled to 0° C., 2.39 g of pivaryl chloride was added dropwise thereto and the mixture was stirred at room temperature for 17 hours. After the reaction, the reaction mixture was charged to 100 g of iced water to obtain crystals, and then the crystals were filtrated. The crystals were washed with n-heptane, and then filtrated and dried to obtain 2.65 g of white crystals in the yield of 85.1%. The structure of the crystals was defined as the following formula by MS and NMR.

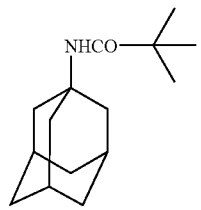

NITROGEN CONTAINING COMPOUND SYNTHESIS EXAMPLE 2

Synthesis of Nitrogen Containing Compound D2

The reaction, post treatment and analyses were conducted in the same manner as in Nitrogen Containing Compound Synthesis Example 1 except that 2.91 g of cyclohexylamine was used instead of 2.39 g of pivaloyl chloride. Finally, 2.85 g of white crystals was obtained in the yield of 82.5%. The structure of the crystals was defined as the following formula.

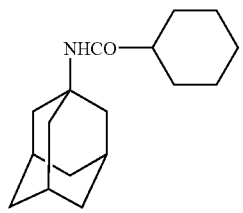

NITROGEN CONTAINING COMPOUND SYNTHESIS EXAMPLE 3

Synthesis of Nitrogen Containing Compound D3

Into a 500 ml flask were charged 72.4 g of toluene, 18.1 g of dicyclohexylamine and 100 g of 15.3% aqueous solution of sodium carbonate. The solution was cooled to 5° C. To the solution, was added dropwise the mixture solution of 17.6 g of cyclohexylcarbonyl chloride and 17.6 g of toluene at a temperature of 5 to 10° C. for 30 minutes. After the addition, the mixture was stirred at room temperature for 16 hours, then stirred at 50 to 55° C. for 4.5 hours. After the reaction, the reaction mixture was charged in 1000 ml of ethyl acetate, and then separated to obtain oil phase. The oil phase obtained was washed with 200 ml of 1.5% hydrochloric acid solution, then was washed with 300 ml of water three times. The washed oil phase was concentrated by rotary evaporator finally at 80° C., 3 torr (400 Pa) to obtain 19.5 g of the concentrate. The concentrate obtained was dissolved in 50 g of methanol and the solution was cooled to room temperature. To the solution, 5 g of conc. hydrochloric acid solution was added. To the mixture was added 50 g of water at room temperature for 30 minutes. After the addition, the mixture was stirred at room temperature for 30 minutes. After the stir, the resultant mixture was filtrated to obtain crystals. The crystals were washed with 200 ml of water. Then, the crystals obtained was dried at 80° C., 3 torr (400 Pa) for 8 hours to obtain 16.5 g of colorless crystals. The crystals were analyzed by gas chromatography (GC-14A manufactured by Shimazu, 30 m capillary column(DB-1, manufactured by J & W Scientific Co., Ltd.)) and the purity was 100%. The yield was 55.7% based on dicyclohexylamine. The structure of the crystals was defined as the following structure by NMR and gas chromatography.

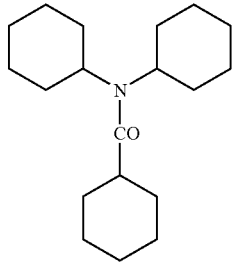

NITROGEN CONTAINING COMPOUND SYNTHESIS EXAMPLE 4

Synthesis of Nitrogen Containing Compound D4

Into a 500 ml flask were charged 172 g of toluene and 43.5 g of dicyclohexylamine. To the solution, was added dropwise the mixture solution of 20.3 g of isophthaloyl chloride and 20.3 g of toluene at a temperature of 18 to 25° C. for 60 minutes. After the addition, the mixture was stirred at room temperature for 1 hour. To the mixture was added dropwise 199.5 g of 15.3% aqueous sodium carbonate solution at 20 to 22° C. for 60 minutes, and then was stirred at room temperature for 7 hours. The resultant mixture was heated to 60° C. and then to this was added 300 ml of ethyl acetate, and then mixing and settling was performed to obtain oil phase. The oil phase obtained was washed with 300 ml of water three times. The washed oil phase was concentrated by rotary evaporator, finally at 80° C., 10 Torr (1333 Pa) to obtain 56.4 g of the concentrate. The concentrate obtained was dissolved in 120 g of methanol and the solution was cooled to room temperature. To the solution, 8.3 g of conc. hydrochloric acid was added. To the mixture was added 120 g of water at room temperature for 30 minutes. During the addition of water, crystals were deposited first, but became sticky mass. After the addition, the mixture was cooled to 5° C., and maintained at the temperature for 4 hours. The mass was solidified by the cooling. The solid was pulled out by decantation. After crushing in a mortar, the powder was placed on a glass filter, and then was washed with 500 ml of water. The powder obtained was dried under the condition of 70° C. and 10 Torr (1333 Pa) for 8 hours to obtain 49.5 g of dry powder. The dry powder was dissolved in 100 g of methanol at 60 to 65° C., and then, to the solution was added dropwise 25 g of water at 60 to 65° C. for 10 minutes. After the addition, the mixture was cooled to 20° C., and then maintained at 18 to 20° C. for 2 hours under stirring. The resultant mixture was filtrated through glass filter to obtain solid cake, and the cake was washed with 80% aqueous methanol. The wet cake was dried under the condition of 80° C. and 3 Torr (400 Pa) to obtain 46.6 g of colorless crystals. The crystals were analyzed by gas chromatography (GC-14A manufactured by Shimazu, 30 m capillary column(DB-1, manufactured by J & W Scientific Co., Ltd.)) and the purity was 99.2%. The yield was 94.6% based on dicyclohexylamine. The structure of the crystals was defined as the following structure by NMR and gas chromatography.

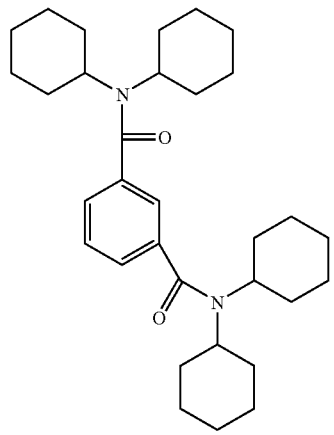

ACID GENERATOR SYNTHESIS EXAMPLE 1

Synthesis of acid generator B1

Into a flask were charged 20 parts of 2,4,6-triisopropyl-3-nitrobenzenesulfonic acid, 80 parts of acetonitrile and 40 parts of acetone, and the mixture was stirred at room temperature for 16 hours. To this was added 7.46 parts of silver oxide, and the mixture was stirred at room temperature for 16 hours, and then filtered and concentrated to obtain 23.68 parts of silver 2,4,6-triisopropyl-3-nitrobenzenesulfonate.

Into a flask were 20 parts of silver 2,4,6-triisopropyl-3-nitrobenzenesulfonate and 185.35 parts of methanol. To this was added dropwise the mixture of 18.53 parts of p-tolyldiphenylsulfonium iodide and 185.35 parts of methanol, and then the mixture was stirred for 16 hours at room temperature. After filtration, to the filtrate was concentrated. To the concentrate was added 300 parts of chloroform, and washed with 75 parts of ion-exchanged water 3 times. The organic layer obtained was concentrated. To the concentrate was added t-butyl methyl ether for crystallization to obtain 22.07 parts of intended compound The compound was defined as 4-methylphenyldiphenylsulfonium 2,4,6-triisopropyl-3-nitrobenzenesulfonate of the following structure by NMR ("GX-270" manufactured by JEOL Ltd.).

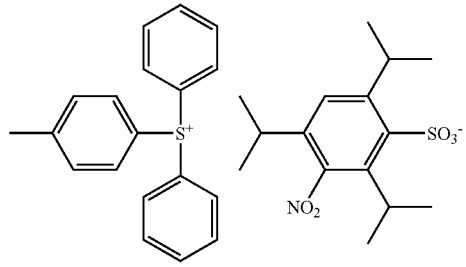

RESIN SYNTHESIS EXAMPLE 1

(Synthesis of Resin A1)

2-Ethyl-2-adamantyl methacrylate, 5-methacryloyloxy-2,6-norbornenelactone and α-methacryloyloxy-γ-butyrolactone were charged at a molar ratio of 35:40.25 (12.42 g:12.70 g:5.58 g), and 30.70 g of 1,4-dioxane was added, and then was added 0.70 g of azobisisobutyronitrile as an initiator to prepare solution. In another flask, 46.04 g of 1,4-dioxane was charged and heated to 87° C. To this was added the solution obtained above over one hour and the mixture was stirred for 5 hours maintaining the temperature. Then, operation of pouring into large 2 0 amount of n-heptane to cause crystallization was repeated three times for purification, and then dried to obtain 25.4 g (Yield: 82.7%) of copolymer having an average molecular weight of 8900. This is called resin A1.

RESIN SYNTHESIS EXAMPLE 2

(Synthesis of Resin A2)

2-Ethyl-2-adamantyl methacrylate, 3-hydroxy-1-adamantyl methacrylate and α-methacryloyloxy-γ-butyrolactone were charged at a molar ratio of 5:2.5:2.5 (20.0 parts:9.5 parts:7.3 parts), and methyl isobutyl ketone in twice weight based on all monomers was added, to prepare solution. To the solution was added azobisisobutyronitrile as an initiator in a ratio of 2 mol % based on all monomer molar amount and the mixture was heated at 80° C. for about 8 hours. Then, the reaction solution was poured into large amount of heptane to cause precipitation, and this operation was repeated three times for purification. As a result, copolymer having a weight-average molecular weight of about 9,200 was obtained. This is called resin A2.

Next, resist compositions were prepared by using the following nitrogen containing compounds.

<Nitrogen Containing Compound>

D1: The compound produced in Nitrogen Containing Compound Synthesis Example 1

D2: The compound produced in Nitrogen Containing Compound Synthesis Example 2

D3: The compound produced in Nitrogen Containing Compound Synthesis Example 3

D4: The compound produced in Nitrogen Containing Compound Synthesis Example 4
D5: The compound of the formula D5

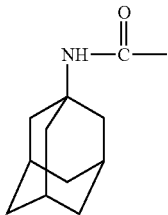

D6: The compound of the formula D6

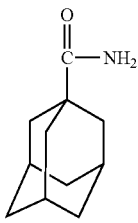

D7: The compound of the formula D7

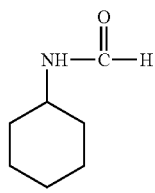

C1: 2,6-diisopropylaniline

EXAMPLES 1 TO 8 AND COMPARATIVE EXAMPLES 1 TO 3

The following components were mixed and dissolved, further, filtrated through a fluorine resin filter having pore diameter of 0.2 μm, to prepare resist liquid.

<Acid Generator>
B1:4-methylphenyldiphenylsulfonium 2,4,6-triisopropyl-3-nitrobenzenesulfonate 0.22 part
B2: p-tolyldiphenylsulfonium perfluorooctanesulfonate 0.2 part <Resin>
A1: 10 parts
A2: 10 parts
(kind and amount are described in Table 1)

<Nitrogen Containing Compound>
(kind and amount are described in Table 1)

<Solvent>

| propylene glycol monomethyl ether acetate | 33.25 parts |
| 2-heptane | 33.25 parts |
| γ-butyrolactone | 3.5 parts |

Silicon wafers were each coated with "ARC-29A-8", which is an organic anti-reflective coating composition available from Brewer Co., and then baked under the conditions: 215° C., 60 seconds, to form a 780 Å-thick organic anti-reflective coating. Each of the resist liquids prepared as above was spin-coated over the anti-reflective coating so that the thickness of the resulting film became 0.30 μm after drying. The silicon wafers thus coated with the respective resist liquids were each prebaked on a direct hotplate at temperature shown in "PB" column in Table 1 for 60 seconds. Using an ArF excimer stepper ("NSR ArF" manufactured by Nikon Corporation, NA=0.55, ⅔ Annular), each wafer thus formed with the respective resist film was subjected to line and space pattern exposure, with the exposure quantity being varied stepwise.

After the exposure, each wafer was subjected to post-exposure baking on a hotplate at temperature shown in "PEB" column in Table 1 for 60 seconds and then to paddle development for 60 seconds with an aqueous solution of 2.38 wt % tetramethylammonium hydroxide.

A bright field pattern developed on the organic anti-reflective coating substrate was observed with a scanning electron microscope, the results of which are shown in Table 2. The term "bright field pattern", as used herein, means a pattern obtained by exposure and development through a reticle comprising an outer fame made of a chromium layer (light-shielding layer) and linear chromium layers (light-shielding layers) formed on a glass surface (light-transmitting portion) extending inside the outer frame. Thus, the bright field pattern is such that, after exposure and development, resist layer surrounding the line and space pattern is removed while resist layer corresponding to the outer frame is left on the outer side of the region from which the resist layer is removed.

Effective sensitivity: It is expressed as the amount of exposure that the line pattern (light-shielding layer) and the space pattern (light-transmitting layer) become 1:1 after exposure through 0.13 μm line and space pattern mask and development.

Resolution: It is expressed as the minimum size of space pattern which gave the space pattern split by the line pattern at the exposure amount of the effective sensitivity.

Rectangularity of Pattern (T/B): It is represented by the T/B, wherein T is a size of upper part of 0.13 μm line and space pattern obtained at the exposure amount of the effective sensitivity, and B is a size of lower part of said 0.13 μm line and space pattern.

TABLE 1

| Example No. | Resin (Parts) | Acid Generator (Part) | Nitrogen Containing Compound (Part) | PB | PEB |
| --- | --- | --- | --- | --- | --- |
| Example 1 | A1/10 | B1/0.22 | D1/0.0075 | 140° C. | 125° C. |
| Example 2 | A1/10 | B1/0.22 | D2/0.0075 | 140° C. | 125° C. |
| Example 3 | A1/10 | B1/0.22 | D3/0.0075 | 140° C. | 125° C. |
| Example 4 | A1/10 | B1/0.22 | D4/0.0075 | 140° C. | 125° C. |
| Example 5 | A1/10 | B1/0.22 | D5/0.0075 | 140° C. | 125° C. |
| Example 6 | A1/10 | B1/0.22 | D6/0.0075 | 140° C. | 125° C. |
| Example 7 | A1/10 | B1/0.22 | D7/0.0075 | 140° C. | 125° C. |
| Exam le 8 | A2/10 | B1/0.22 | D5/0.0075 | 140° C. | 125° C. |
| Comparative Example 1 | A1/10 | B1/0.22 | C1/0.0075 | 140° C. | 125° C. |
| Comparative Example 2 | A2/10 | B2/0.20 | D5/0.0075 | 140° C. | 125° C. |
| Comparative Example 3 | A2/10 | B2/0.20 | C1/0.0075 | 140° C. | 125° C. |

TABLE 2

| Example No. | Effective Sensitivity (mJ/cm$^2$) | Resolution (μm) | Rectangularity of Pattern |
|---|---|---|---|
| Example 1 | 27 | 0.12 | 0.97 |
| Example 2 | 25 | 0.12 | 0.98 |
| Example 3 | 27 | 0.12 | 1.05 |
| Example 4 | 18 | 0.12 | 1.05 |
| Example 5 | 35 | 0.12 | 0.98 |
| Example 6 | 26 | 0.12 | 0.96 |
| Example 7 | 27 | 0.12 | 1.05 |
| Example 8 | 54 | 0.12 | 1.05 |
| Comparative Example 1 | 35 | 0.12 | 0.89 |
| Comparative Example 2 | 16 | 0.12 | 0.90 |
| Comparative Example 3 | 20 | 0.12 | 0.89 |

The chemical amplification type resist composition of the present invention provides greatly improved rectangularity of resist patterns and the composition possesses various excellent properties such as high sensitivity and high resolution, and the like. Therefore, it is suitable for excimer laser lithography using ArF, KrF.

What is claimed is:

1. A chemical amplification type positive resist composition comprising a nitrogen containing compound of the formula (IIIa):

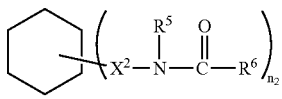

wherein $X^2$ represents alkylene having 1 to 4 carbon atoms or a single bond, $R^5$ represents hydrogen, alkyl having 1 to 12 carbon atoms, cycloalkyl having 3 to 12 carbon atoms, haloalkyl having 1 to 12 carbon atoms, alkyl having 2 to 12 carbon atoms in which at least one —CH$_2$— other than that binding to the adjacent group is substituted by —S— or —O—, alkoxy having 1 to 12 carbon atoms, or an aromatic hydrocarbon group optionally substituted, $R^6$ represent hydrogen, alkyl having 1 to 12 carbon atoms, cycloalkyl having 3 to 12 carbon atoms, haloalkyl having 1 to 12 carbon atoms, alkyl having 2 to 12 carbon atoms in which at least one —CH$_2$— other than that binding to the adjacent group is substituted by —S— or —O—, alkoxy having 1 to 12 carbon atoms, an aromatic hydrocarbon group optionally substituted, or arylamino optionally substituted, and $n_2$ denotes an integer of 1 to 5, with the proviso that when $n_2$ is 2 or more, each of —X$^2$—NR$^5$—CO—R$^6$ in the formula (IIIa) may be different, a resin which contains a structural unit having an acid labile group and which itself is insoluble or poorly soluble in an alkali aqueous solution but becomes soluble in an alkali aqueous solution by the action of an acid and which further contains a structural unit derived from 2-norbornene and a structural unit derived from an aliphatic unsaturated dicarboxylic anhydride; and an acid generator of the formula (I):

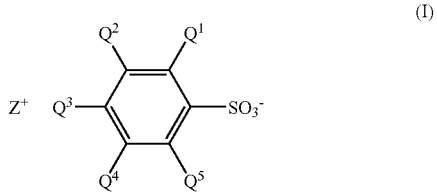

wherein $Q^1$, $Q^2$, $Q^3$, $Q^4$ and $Q^5$ each independently represent hydrogen, hydroxyl, alkyl having 1 to 12 carbon atoms, alkoxy having 1 to 12 carbon atoms or an electron-withdrawing group, and $Z^+$ represents a group of the formula (Va), (Vb) or (Vc):

a group of the formula (Va):

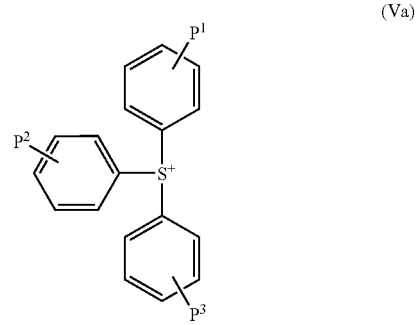

wherein $P^1$, $P^2$ and $P^3$ each independently represent hydrogen, hydroxyl, alkyl having 1 to 6 carbon atoms or alkoxy having 1 to 6 carbon atoms;

a group of the formula (Vb):

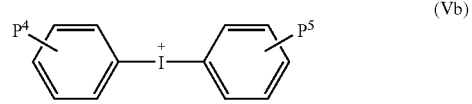

wherein $P^4$ and $P^5$ each independently represent hydrogen, hydroxyl, alkyl having 1 to 6 carbon atoms or alkoxy having 1 to 6 carbon atoms;

a group of the formula (Vc):

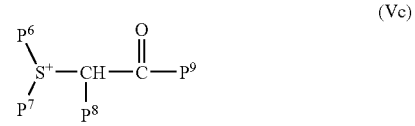

wherein $P^6$ and $P^7$ each independently represent alkyl having 1 to 6 carbon atoms or cycloalkyl having 3 to 10 carbon atoms, or $P^6$ and $P^7$ bond to form divalent acyclic hydrocarbon having 3 to 7 carbon atoms which form a ring together with the adjacent S$^+$, and at least one —CH$_2$— in the divalent acyclic hydrocarbon may be substituted by —CO—, —O— or —S—; $P^8$ represents hydrogen, $P^9$ represents alkyl having 1 to 6 carbon atoms, cycloalkyl having 3 to 10 carbon atoms or an aromatic group optionally substituted, or $P^8$ and $P^9$ bond to form 2-oxocycloalkyl together with the adjacent —CHCO—.

2. The composition according to claim 1, wherein the content of the nitrogen containing compound of the formula (IIIa), the content of the resin, and the content of the acid generator are 0.01 to 1% by weight, 80 to 99.89% by weight and 0.1 to 19.99% by weight, respectively, based on the total solid content of the composition.

3. The composition according to claim 1, wherein the content of the structural unit having an acid labile group is 10 to 80% by weight in the total structural units of the resin.

4. The composition according to claim 1, wherein the structural unit having an acid-labile group is a structural unit derived from a 2-alkyl-2-adamantyl (meth)acrylate or a 1-(1-adamantyl)-1-alkylalkyl (meth)acrylate.

5. The composition according to claim 1, wherein the resin contains, in addition to the structural unit having the acid-labile group and the structural unit derived from 2-norbornene and a structural unit derived from an aliphatic unsaturated dicarboxylic acid, further at least one structural unit selected from the group consisting of a structural unit derived from 3-hydroxy-1-adamantyl (meth)acrylate, a structural unit derived from 3,5-dihydroxy-1-adamantyl (meth)acrylate, a structural unit derived from (meth)acryloyloxy-γ-butyrolactone having a lactone ring optionally substituted by alkyl, a structural unit of the formula (IVa) and a structural unit of the following formula (IVb):

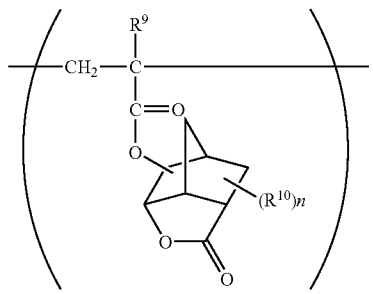

(IVa)

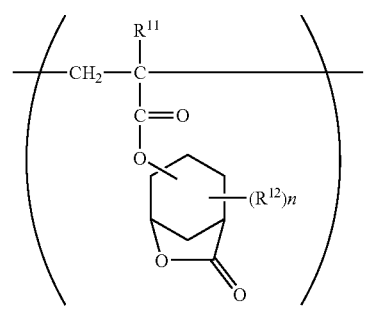

(IVb)

wherein $R^9$, $R^{10}$, $R^{11}$ and $R^{12}$ each independently represent hydrogen or methyl, and n represents an integer of 1 to 3, with the proviso that when n is more than 1, each of the plurality of $R^{10}$ or $R^{12}$ may be different.

6. The composition according to claim 1, wherein the structural unit derived from 2-norbornene is a structural unit of the formula (VII):

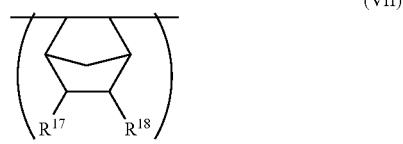

(VII)

wherein $R^{17}$ and $R^{18}$ each independently represent hydrogen, alkyl having 1 to 3 carbon atoms, hydroxyalkyl having 1 to 3 carbon atoms, carboxyl, cyano or a —COOZ group in which Z represents an alcohol residue, or $R^{17}$ and $R^{18}$ bond together to form a carboxylic anhydride residue represented by —C(=O)OC(=O)—, and the structural unit derived from the aliphatic unsaturated dicarboxylic anhydride is at least one structural unit selected from the group consisting of the formulae (VIII) and (IX):

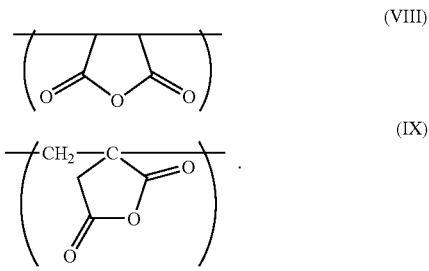

(VIII)

(IX)

7. The composition according to claim 1, which further comprises a surfactant.

8. A chemical amplification type positive resist composition comprising a nitrogen containing compound of the formula (VIa):

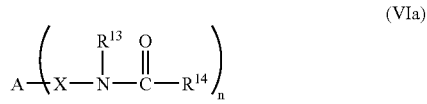

(VIa)

wherein A represents an alicyclic hydrocarbon group optionally substituted, X represents alkylene having 1 to 4 carbon atoms or a single bond, $R^{13}$ represents hydrogen, alkyl having 1 to 12 carbon atoms, cycloalkyl having 3 to 12 carbon atoms, haloalkyl having 1 to 12 carbon atoms, alkyl having 2 to 12 carbon atoms in which at least one —CH$_2$— other than that binding to the adjacent group is substituted by —S— or —O—, alkoxy having 1 to 12 carbon atoms, or an aromatic group optionally substituted, $R^{14}$ represents hydrogen, alkyl having 1 to 12 carbon atoms, cycloalkyl having 3 to 12 carbon atoms, haloalkyl having 1 to 12 carbon atoms, alkyl having 2 to 12 carbon atoms in which at least one —CH$_2$— other than that binding to the adjacent group is substituted by —S— or —O—, alkoxy having 1 to 12 carbon atoms, an aromatic hydrocarbon group optionally substituted, or arylamino optionally substituted, and n denotes an integer of 1 to 5, with the proviso that when n is 2 or more, each of —X—NR$^{13}$—CO—R$^{14}$ in the formula (VIa) may be different, a resin which contains a structural unit having an acid labile group and which itself is insoluble or poorly soluble in an alkali aqueous solution but becomes soluble in an alkali aqueous solution by the action of an acid and which further contains a structural unit derived from 2-norbornene and a structural unit derived from an aliphatic unsaturated dicarboxylic anhydride; and an acid generator of the formula (I):

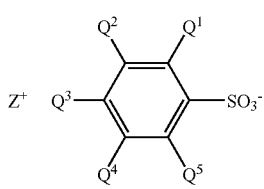

(I)

wherein $Q^1$, $Q^2$, $Q^3$, $Q^4$ and $Q^5$ each independently represent hydrogen, hydroxyl, alkyl having 1 to 12 carbon atoms, alkoxy having 1 to 12 carbon atoms or an electron-withdrawing group, and $Z^+$ represents a group of the formula (Va), (Vb) or (Vc):

a group of the formula (Va):

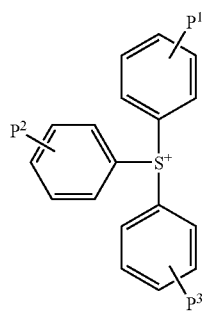

(Va)

wherein $P^1$, $P^2$ and $P^3$ each independently represent hydrogen, hydroxyl, alkyl having 1 to 6 carbon atoms or alkoxy having 1 to 6 carbon atoms;

a group of the formula (Vb):

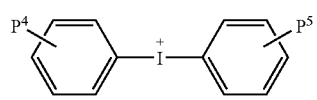

(Vb)

wherein $P^4$ and $P^5$ each independently represent hydrogen, hydroxyl, alkyl having 1 to 6 carbon atoms or alkoxy having 1 to 6 carbon atoms;

a group of the formula (Vc):

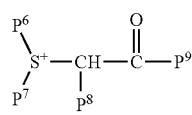

(Vc)

wherein $P^6$ and $P^7$ each independently represent alkyl having 1 to 6 carbon atoms or cycloalkyl having 3 to 10 carbon atoms, or $P^6$ and $P^7$ bond to form divalent acyclic hydrocarbon having 3 to 7 carbon atoms which form a ring together with the adjacent $S^+$, and at least one —CH$_2$— in the divalent acyclic hydrocarbon may be substituted by —CO—, —O— or —S—; $P^8$ represents hydrogen, $P^9$ represents alkyl having 1 to 6 carbon atoms, cycloalkyl having 3 to 10 carbon atoms or an aromatic group optionally substituted, or $P^8$ and $P^9$ bond to form 2-oxocycloalkyl together with the adjacent —CHCO—.

9. The composition according to claim 8, wherein the content of the nitrogen containing compound of the formula (IIIa), the content of the resin, and the content of the acid generator are 0.01 to 1% by weight, 80 to 99.89% by weight and 0.1 to 19.99% by weight, respectively, based on the total solid content of the composition.

10. The composition according to claim 8, wherein the nitrogen containing compound is a compound of the formula (IIa):

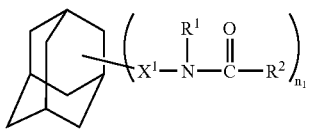

wherein $X^1$ represents alkylene having 1 to 4 carbon atoms or a single bond, $R^1$ represents hydrogen, alkyl having 1 to 12 carbon atoms, cycloalkyl having 3 to 12 carbon atoms, haloalkyl having 1 to 12 carbon atoms, alkyl having 2 to 12 carbon atoms in which at least one —CH$_2$— other than that binding to the adjacent group is substituted by —S— or —O—, alkoxy having 1 to 12 carbon atoms, or an aromatic hydrocarbon group optionally substituted, $R^2$ represents hydrogen, alkyl having 1 to 12 carbon atoms, cycloalkyl having 3 to 12 carbon atoms, haloalkyl having 1 to 12 carbon atoms, alkyl having 2 to 12 carbon atoms in which at least one —CH$_2$— other than that binding to the adjacent group is substituted by —S— or —O—, alkoxy having 1 to 12 carbon atoms, an aromatic hydrocarbon group optionally substituted, or arylamino optionally substituted, and $n_1$ denotes an integer of 1 to 5, with the proviso that when $n_1$ is 2 or more, each of —X$^1$—NR$^1$—CO—R$^2$ in the formula (IIa) may be different.

11. The composition according to claim 8, wherein the content of the structural unit having an acid labile group is 10 to 80% by weight in the total structural units of the resin.

12. The composition according to claim 8, wherein the structural unit having an acid-labile group is a structural unit derived from a 2-alkyl-2-adamantyl (meth)acrylate or a 1-(1-adamantyl)-1-alkylalkyl (meth)acrylate.

13. The composition according to claim 8, wherein the resin contains, in addition to the structural unit having the acid-labile group and the structural unit derived from 2-norbornene and a structural unit derived from an aliphatic unsaturated dicarboxylic anhydride, further at least one structural unit selected from the group consisting of a structural unit derived from 3-hydroxy-1-adamantyl (meth)acrylate, a structural unit derived from 3,5-dihydroxy-1- adamantyl (meth)acrylate, a structural unit derived from (meth)acryloyloxy-γ-butyrolactone having a lactone ring optionally substituted by alkyl, a structural unit of the formula (IVa) and a structural unit of the following formula (IVb):

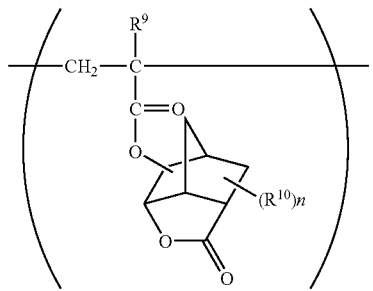

(IVa)

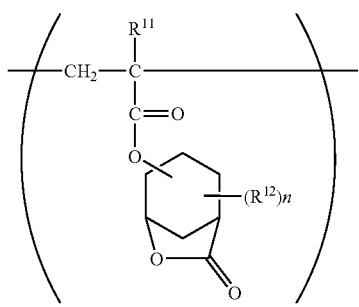

(IVb)

wherein $R^9$, $R^{10}$, $R^{11}$ and $R^{12}$ each independently represent hydrogen or methyl, and n represents an integer of 1 to 3, with the proviso that when n is more than 1, each of the plurality of $R^{10}$ or $R^{12}$ may be different.

14. The composition according to claim 8, wherein the structural unit derived from 2-norbornene is a structural unit of the formula (VII):

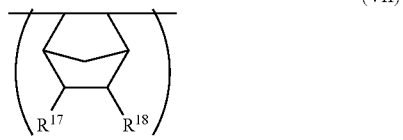

(VII)

wherein $R^{17}$ and $R^{18}$ each independently represent hydrogen, alkyl having 1 to 3 carbon atoms, hydroxyalkyl having 1 to 3 carbon atoms, carboxyl, cyano or a —COOZ group in which Z represents an alcohol residue, or $R^{17}$ and $R^{18}$ bond together to form a carboxylic anhydride residue represented by —C(=O)OC(=O)—, and the structural unit derived from the aliphatic unsaturated dicarboxylic anhydride is at least one structural unit selected from the group consisting of the formulae (VIII) and (IX):

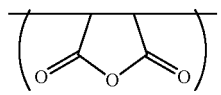

(VIII)

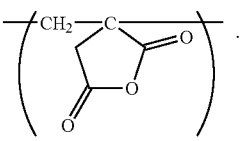

(IX)

15. The composition according to claim 8, which further comprises a surfactant.

* * * * *